US012216924B2

(12) United States Patent
Atsumi et al.

(10) Patent No.: US 12,216,924 B2
(45) Date of Patent: *Feb. 4, 2025

(54) SEMICONDUCTOR DEVICE AND SEMICONDUCTOR STORAGE DEVICE

(71) Applicant: KIOXIA CORPORATION, Tokyo (JP)

(72) Inventors: Tsuyoshi Atsumi, Kodaira (JP); Yasuhiko Kurosawa, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/500,577

(22) Filed: Nov. 2, 2023

(65) Prior Publication Data

US 2024/0061590 A1 Feb. 22, 2024

Related U.S. Application Data

(63) Continuation of application No. 17/988,081, filed on Nov. 16, 2022, now Pat. No. 11,875,041, which is a continuation of application No. 17/200,264, filed on Mar. 12, 2021, now Pat. No. 11,543,977.

(30) Foreign Application Priority Data

Jun. 2, 2020 (JP) ................................ 2020-096429

(51) Int. Cl.

| | |
|---|---|
| ***G11C 19/00*** | (2006.01) |
| ***G06F 3/06*** | (2006.01) |
| ***G06F 7/58*** | (2006.01) |
| ***G11C 7/10*** | (2006.01) |

(52) U.S. Cl.

CPC .......... *G06F 3/0623* (2013.01); *G06F 3/0619* (2013.01); *G06F 3/0679* (2013.01); *G06F 7/584* (2013.01); *G11C 7/1006* (2013.01); *G11C 7/1036* (2013.01); *G11C 19/00* (2013.01)

(58) Field of Classification Search

CPC .... G06F 3/0623; G06F 3/0619; G06F 3/0679; G06F 7/584; G11C 7/1006; G11C 7/1036; G11C 19/00

USPC .................................................... 365/189.12

See application file for complete search history.

(56) References Cited

U.S. PATENT DOCUMENTS

| | | | | |
|---|---|---|---|---|
| 9,921,772 | B2 | 3/2018 | Atsumi et al. | |
| 10,430,101 | B2 | 10/2019 | Atsumi et al. | |
| 10,459,691 | B2 | 10/2019 | Atsumi et al. | |
| 10,678,707 | B2 * | 6/2020 | Poeppelmann | .... G11C 16/3427 |

(Continued)

FOREIGN PATENT DOCUMENTS

| | | |
|---|---|---|
| JP | 2003-299862 A | 10/2003 |
| JP | 2007-87064 A | 4/2007 |

(Continued)

*Primary Examiner* — Huan Hoang
*Assistant Examiner* — Minh Dinh
(74) *Attorney, Agent, or Firm* — Oblon, McClelland, Maier & Neustadt, L.L.P.

(57) ABSTRACT

A semiconductor device of an embodiment includes a seed generator circuit configured to generate a seed from inputted data by using first random number sequence data generated by an XorShift circuit; and a random number generator circuit configured to receive the seed as input to generate second random number sequence data by a second XorShift circuit.

18 Claims, 29 Drawing Sheets

(56) References Cited

U.S. PATENT DOCUMENTS

| | | | |
|---|---|---|---|
| 10,748,589 | B1 | 8/2020 | Yamada |
| 10,884,706 | B2 | 1/2021 | Atsumi et al. |
| 11,543,977 | B2 * | 1/2023 | Atsumi ................ G11C 7/1036 |
| 11,875,041 | B2 * | 1/2024 | Atsumi ................... G06F 7/584 |
| 2014/0136583 | A1 | 5/2014 | Hyde |
| 2015/0358154 | A1 | 12/2015 | Garcia Morchon et al. |
| 2019/0012147 | A1 * | 1/2019 | Wen .......................... G06F 7/58 |
| 2021/0258388 | A1 | 8/2021 | Takai |

FOREIGN PATENT DOCUMENTS

| | | | |
|---|---|---|---|
| JP | 2007-333854 | A | 12/2007 |
| JP | 2016-505887 | A | 2/2016 |
| JP | 6499065 | B2 | 4/2019 |
| JP | 6542171 | B2 | 7/2019 |
| JP | 2020-27473 | A | 2/2020 |
| JP | 6697618 | B2 | 5/2020 |
| WO | WO 2020/044393 | A1 | 3/2020 |

* cited by examiner

FIG. 4

TBL

| | | String0 | | | | String1 | | | | String2 | | | | String3 | | | |
|---|---|---|---|---|---|---|---|---|---|---|---|---|---|---|---|---|---|
| | | frame0 | frame1 | frame2 | frame3 | frame0 | frame1 | frame2 | frame3 | frame0 | frame1 | frame2 | frame3 | frame0 | frame1 | frame2 | frame3 |
| WL0 | L | 1 | 2 | 3 | 4 | 13 | 14 | 15 | 16 | 25 | 26 | 27 | 28 | 37 | 38 | 39 | 40 |
| | M | 5 | 6 | 7 | 8 | 17 | 18 | 19 | 20 | 29 | 30 | 31 | 32 | 41 | 42 | 23 | 44 |
| | U | 9 | 10 | 11 | 12 | 21 | 22 | 23 | 24 | 33 | 34 | 35 | 36 | 45 | 46 | 47 | 48 |
| WL1 | L | 49 | 50 | 51 | 52 | ... | ... | ... | ... | ... | ... | ... | ... | ... | ... | ... | ... |
| | M | 53 | 54 | 55 | 56 | ... | ... | ... | ... | ... | ... | ... | ... | ... | ... | ... | ... |
| | U | 57 | 58 | 59 | 60 | ... | ... | ... | ... | ... | ... | ... | ... | ... | ... | ... | ... |
| WL2 | L | ... | ... | ... | ... | ... | ... | ... | ... | ... | ... | ... | ... | ... | ... | ... | ... |
| | M | ... | ... | ... | ... | ... | ... | ... | ... | ... | ... | ... | ... | ... | ... | ... | ... |
| | U | ... | ... | ... | ... | ... | ... | ... | ... | ... | ... | ... | ... | ... | ... | ... | ... |
| : | : | : | : | : | : | : | : | : | : | : | : | : | : | : | : | : | : |
| WL95 | L | ... | ... | ... | ... | ... | ... | ... | ... | ... | ... | ... | ... | 4597 | 4598 | 4599 | 4600 |
| | M | ... | ... | ... | ... | ... | ... | ... | ... | ... | ... | ... | ... | 4601 | 4602 | 4603 | 4604 |
| | U | ... | ... | ... | ... | ... | ... | ... | ... | ... | ... | ... | ... | 4605 | 4606 | 4607 | 4608 |

FIG. 5

```
uint32_t XorShift32(uint32_t in) {
    tmp1 = in ^ (in << 5);
    tmp2 = tmp1 ^ (tmp1 >> 17);
    out  = tmp2 ^ (tmp2 << 13);
    return out;
}
```

FIG. 7

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 63 | 7C | 77 | 7B | F2 | 6B | 6F | C5 | 30 | 01 | 67 | 2B | FE | D7 | AB | 76 |
| 1 | CA | 82 | C9 | 7D | FA | 59 | 47 | F0 | AD | D4 | A2 | AF | 9C | A4 | 72 | C0 |
| 2 | B7 | FD | 93 | 26 | 36 | 3F | F7 | CC | 34 | A5 | E5 | F1 | 71 | D8 | 31 | 15 |
| 3 | 04 | C7 | 23 | C3 | ... | ... | ... | ... | ... | ... | ... | ... | ... | ... | ... | ... |
| 4 | ... | ... | ... | ... | ... | ... | ... | ... | ... | ... | ... | ... | ... | ... | ... | ... |
| 5 | ... | ... | ... | ... | ... | ... | ... | ... | ... | ... | ... | ... | ... | ... | ... | ... |
| 6 | ... | ... | ... | ... | ... | ... | ... | ... | ... | ... | ... | ... | ... | ... | ... | ... |
| 7 | ... | ... | ... | ... | ... | ... | ... | ... | ... | ... | ... | ... | ... | ... | ... | ... |
| 8 | ... | ... | ... | ... | ... | ... | ... | ... | ... | ... | ... | ... | ... | ... | ... | ... |
| 9 | ... | ... | ... | ... | ... | ... | ... | ... | ... | ... | ... | ... | ... | ... | ... | ... |
| A | ... | ... | ... | ... | ... | ... | ... | ... | ... | ... | ... | ... | ... | ... | ... | ... |
| B | ... | ... | ... | ... | ... | ... | ... | ... | ... | ... | ... | ... | ... | ... | ... | ... |
| C | ... | ... | ... | ... | ... | ... | ... | ... | ... | ... | ... | ... | ... | ... | ... | ... |
| D | ... | ... | ... | ... | ... | ... | ... | ... | ... | ... | ... | ... | ... | ... | ... | ... |
| E | ... | ... | ... | ... | ... | ... | ... | ... | ... | ... | ... | ... | ... | ... | ... | ... |
| F | ... | ... | ... | ... | ... | ... | ... | ... | ... | ... | ... | ... | ... | ... | ... | ... |

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 63 | 7C | 77 | 7B | F2 | 6B | 6F | C5 | 30 | 01 | 67 | 2B | FE | D7 | AB | 76 |
| 1 | CA | 82 | C9 | 7D | FA | 59 | 47 | F0 | AD | D4 | A2 | AF | 9C | A4 | 72 | C0 |
| 2 | B7 | FD | 93 | 26 | 36 | 3F | F7 | CC | 34 | A5 | E5 | F1 | 71 | D8 | 31 | 15 |
| 3 | 04 | C7 | 23 | C3 | ··· | ··· | ··· | ··· | ··· | ··· | ··· | ··· | ··· | ··· | ··· | ··· |
| 4 | ··· | ··· | ··· | ··· | ··· | ··· | ··· | ··· | ··· | ··· | ··· | ··· | ··· | ··· | ··· | ··· |
| 5 | ··· | ··· | ··· | ··· | ··· | ··· | ··· | ··· | ··· | ··· | ··· | ··· | ··· | ··· | ··· | ··· |
| 6 | ··· | ··· | ··· | ··· | ··· | ··· | ··· | ··· | ··· | ··· | ··· | ··· | ··· | ··· | ··· | ··· |
| 7 | ··· | ··· | ··· | ··· | ··· | ··· | ··· | ··· | ··· | ··· | ··· | ··· | ··· | ··· | ··· | ··· |
| 8 | ··· | ··· | ··· | ··· | ··· | ··· | ··· | ··· | ··· | ··· | ··· | ··· | ··· | ··· | ··· | ··· |
| 9 | ··· | ··· | ··· | ··· | ··· | ··· | ··· | ··· | ··· | ··· | ··· | ··· | ··· | ··· | ··· | ··· |
| A | ··· | ··· | ··· | ··· | ··· | ··· | ··· | ··· | ··· | ··· | ··· | ··· | ··· | ··· | ··· | ··· |
| B | ··· | ··· | ··· | ··· | ··· | ··· | ··· | ··· | ··· | ··· | ··· | ··· | ··· | ··· | ··· | ··· |
| C | ··· | ··· | ··· | ··· | ··· | ··· | ··· | ··· | ··· | ··· | ··· | ··· | ··· | ··· | ··· | ··· |
| D | ··· | ··· | ··· | ··· | ··· | ··· | ··· | ··· | ··· | ··· | ··· | ··· | ··· | ··· | ··· | ··· |
| E | ··· | ··· | ··· | ··· | ··· | ··· | ··· | ··· | ··· | ··· | ··· | ··· | ··· | ··· | ··· | ··· |
| F | ··· | ··· | ··· | ··· | ··· | ··· | ··· | ··· | ··· | ··· | ··· | ··· | ··· | ··· | ··· | ··· |

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 88 | 8B | 54 | E0 | 66 | 50 | 3C | 00 | FF | F0 | E4 | 64 | D2 | D3 | CC | C0 |
| 1 | 6E | D9 | B4 | 36 | BE | 35 | 7E | 41 | A5 | FB | F8 | A0 | AA | 45 | AC | 46 |
| 2 | 7B | 5B | FD | 62 | 96 | 67 | D7 | 33 | 93 | FC | 0B | 59 | F3 | 90 | 31 | 21 |
| 3 | 43 | D6 | EC | 47 | ... | ... | ... | ... | ... | ... | ... | ... | ... | ... | ... | ... |
| 4 | ... | ... | ... | ... | ... | ... | ... | ... | ... | ... | ... | ... | ... | ... | ... | ... |
| 5 | ... | ... | ... | ... | ... | ... | ... | ... | ... | ... | ... | ... | ... | ... | ... | ... |
| 6 | ... | ... | ... | ... | ... | ... | ... | ... | ... | ... | ... | ... | ... | ... | ... | ... |
| 7 | ... | ... | ... | ... | ... | ... | ... | ... | ... | ... | ... | ... | ... | ... | ... | ... |
| 8 | ... | ... | ... | ... | ... | ... | ... | ... | ... | ... | ... | ... | ... | ... | ... | ... |
| 9 | ... | ... | ... | ... | ... | ... | ... | ... | ... | ... | ... | ... | ... | ... | ... | ... |
| A | ... | ... | ... | ... | ... | ... | ... | ... | ... | ... | ... | ... | ... | ... | ... | ... |
| B | ... | ... | ... | ... | ... | ... | ... | ... | ... | ... | ... | ... | ... | ... | ... | ... |
| C | ... | ... | ... | ... | ... | ... | ... | ... | ... | ... | ... | ... | ... | ... | ... | ... |
| D | ... | ... | ... | ... | ... | ... | ... | ... | ... | ... | ... | ... | ... | ... | ... | ... |
| E | ... | ... | ... | ... | ... | ... | ... | ... | ... | ... | ... | ... | ... | ... | ... | ... |
| F | ... | ... | ... | ... | ... | ... | ... | ... | ... | ... | ... | ... | ... | ... | ... | ... |

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | DD | DE | 4F | C1 | 14 | 34 | 53 | 13 | 2A | 7A | BA | 75 | 9A | 23 | 3A | 67 |
| 1 | B5 | 4B | 9D | 35 | FD | 9F | 09 | 77 | 6D | BF | 22 | 5D | 3D | 58 | 00 | A3 |
| 2 | 69 | EA | 96 | 2E | 7D | 27 | A9 | 43 | 4D | AD | FC | 03 | B7 | 40 | 88 | 6F |
| 3 | 05 | 46 | 6C | AF | ··· | ··· | ··· | ··· | ··· | ··· | ··· | ··· | ··· | ··· | ··· | ··· |
| 4 | ··· | ··· | ··· | ··· | ··· | ··· | ··· | ··· | ··· | ··· | ··· | ··· | ··· | ··· | ··· | ··· |
| 5 | ··· | ··· | ··· | ··· | ··· | ··· | ··· | ··· | ··· | ··· | ··· | ··· | ··· | ··· | ··· | ··· |
| 6 | ··· | ··· | ··· | ··· | ··· | ··· | ··· | ··· | ··· | ··· | ··· | ··· | ··· | ··· | ··· | ··· |
| 7 | ··· | ··· | ··· | ··· | ··· | ··· | ··· | ··· | ··· | ··· | ··· | ··· | ··· | ··· | ··· | ··· |
| 8 | ··· | ··· | ··· | ··· | ··· | ··· | ··· | ··· | ··· | ··· | ··· | ··· | ··· | ··· | ··· | ··· |
| 9 | ··· | ··· | ··· | ··· | ··· | ··· | ··· | ··· | ··· | ··· | ··· | ··· | ··· | ··· | ··· | ··· |
| A | ··· | ··· | ··· | ··· | ··· | ··· | ··· | ··· | ··· | ··· | ··· | ··· | ··· | ··· | ··· | ··· |
| B | ··· | ··· | ··· | ··· | ··· | ··· | ··· | ··· | ··· | ··· | ··· | ··· | ··· | ··· | ··· | ··· |
| C | ··· | ··· | ··· | ··· | ··· | ··· | ··· | ··· | ··· | ··· | ··· | ··· | ··· | ··· | ··· | ··· |
| D | ··· | ··· | ··· | ··· | ··· | ··· | ··· | ··· | ··· | ··· | ··· | ··· | ··· | ··· | ··· | ··· |
| E | ··· | ··· | ··· | ··· | ··· | ··· | ··· | ··· | ··· | ··· | ··· | ··· | ··· | ··· | ··· | ··· |
| F | ··· | ··· | ··· | ··· | ··· | ··· | ··· | ··· | ··· | ··· | ··· | ··· | ··· | ··· | ··· | ··· |

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 77 | 74 | 79 | 83 | F0 | DB | 8D | C8 | 3B | E2 | 21 | 57 | 0A | ED | A7 | E6 |
| 1 | D1 | 0D | 32 | 6B | 5C | 45 | E7 | F4 | 46 | 4B | 3A | F1 | 9F | 62 | B0 | D4 |
| 2 | 24 | E3 | CA | FB | DA | 8C | F9 | 84 | 6D | 67 | EE | 63 | 3F | F5 | B9 | E8 |
| 3 | E0 | 17 | 69 | 54 | ··· | ··· | ··· | ··· | ··· | ··· | ··· | ··· | ··· | ··· | ··· | ··· |
| 4 | ··· | ··· | ··· | ··· | ··· | ··· | ··· | ··· | ··· | ··· | ··· | ··· | ··· | ··· | ··· | ··· |
| 5 | ··· | ··· | ··· | ··· | ··· | ··· | ··· | ··· | ··· | ··· | ··· | ··· | ··· | ··· | ··· | ··· |
| 6 | ··· | ··· | ··· | ··· | ··· | ··· | ··· | ··· | ··· | ··· | ··· | ··· | ··· | ··· | ··· | ··· |
| 7 | ··· | ··· | ··· | ··· | ··· | ··· | ··· | ··· | ··· | ··· | ··· | ··· | ··· | ··· | ··· | ··· |
| 8 | ··· | ··· | ··· | ··· | ··· | ··· | ··· | ··· | ··· | ··· | ··· | ··· | ··· | ··· | ··· | ··· |
| 9 | ··· | ··· | ··· | ··· | ··· | ··· | ··· | ··· | ··· | ··· | ··· | ··· | ··· | ··· | ··· | ··· |
| A | ··· | ··· | ··· | ··· | ··· | ··· | ··· | ··· | ··· | ··· | ··· | ··· | ··· | ··· | ··· | ··· |
| B | ··· | ··· | ··· | ··· | ··· | ··· | ··· | ··· | ··· | ··· | ··· | ··· | ··· | ··· | ··· | ··· |
| C | ··· | ··· | ··· | ··· | ··· | ··· | ··· | ··· | ··· | ··· | ··· | ··· | ··· | ··· | ··· | ··· |
| D | ··· | ··· | ··· | ··· | ··· | ··· | ··· | ··· | ··· | ··· | ··· | ··· | ··· | ··· | ··· | ··· |
| E | ··· | ··· | ··· | ··· | ··· | ··· | ··· | ··· | ··· | ··· | ··· | ··· | ··· | ··· | ··· | ··· |
| F | ··· | ··· | ··· | ··· | ··· | ··· | ··· | ··· | ··· | ··· | ··· | ··· | ··· | ··· | ··· | ··· |

FIG. 15

TBL1

| Q[3:0] | STATE OF SWITCH |
|---|---|
| 0001 | A:ON |
| 0010 | B:ON |
| 0100 | C:ON |
| 1000 | D:ON |

FIG. 16

TBL2

| Q[3:0] | STATE OF SWITCH |
|---|---|
| 0000 | A:ON |
| 0001 | B:ON |
| 0010 | C:ON |
| 0011 | D:ON |
| 0100 | A、B:ON |
| 0101 | A, C:ON |
| 0110 | A, D:ON |
| 0111 | B, C:ON |
| 1000 | B, D:ON |
| 1001 | C, D:ON |
| 1010 | A, B, C:ON |
| 1011 | A, B, D:ON |
| 1100 | A, C, D:ON |
| 1101 | B, C, D:ON |
| 1110 | A, B, C, D:ON |
| 1111 | – |

FIG. 18

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 63 | 60 | 20 | 61 | 40 | 1D | 22 | 39 | 70 | 55 | 5C | 3D | 01 | 32 | 4E | 4A |
| 1 | 68 | 07 | 78 | 73 | 3E | 7D | 0C | 2F | 12 | 06 | 49 | 71 | 37 | 2A | 75 | 51 |
| 2 | 64 | 0E | 11 | 48 | 2C | 59 | 2B | 24 | 4F | 7A | 6C | 43 | 16 | 6E | 05 | 4B |
| 3 | 19 | 7F | 13 | 3F | ... | ... | ... | ... | ... | ... | ... | ... | ... | ... | ... | ... |
| 4 | ... | ... | ... | ... | ... | ... | ... | ... | ... | ... | ... | ... | ... | ... | ... | ... |
| 5 | ... | ... | ... | ... | ... | ... | ... | ... | ... | ... | ... | ... | ... | ... | ... | ... |
| 6 | ... | ... | ... | ... | ... | ... | ... | ... | ... | ... | ... | ... | ... | ... | ... | ... |
| 7 | ... | ... | ... | ... | ... | ... | ... | ... | ... | ... | ... | ... | ... | ... | ... | ... |

FIG. 19

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 063 | 07C | 01B | 1CC | 05F | 106 | 1B4 | 001 | 17D | 1E7 | 0D1 | 0E8 | 188 | 14E | 052 | 0BF |
| 1 | 19B | 072 | 1D6 | 1AD | 13A | 1E1 | 051 | 178 | 096 | 13C | 0F5 | 0E0 | 00C | 01A | 00D | 163 |
| 2 | 1E8 | 09C | 01C | 1D1 | 1B9 | 1BB | 0F3 | 011 | 1CF | 04E | 0D5 | 156 | 17A | 1B8 | 1EE | 1FE |
| 3 | 16E | 0EB | 0CC | 06C | 128 | 17C | 155 | 15D | 123 | 16A | 028 | 15F | 154 | 0FF | 194 | 0E2 |
| 4 | 1A6 | 1E3 | 16B | 067 | ... | ... | ... | ... | ... | ... | ... | ... | ... | ... | ... | ... |
| 5 | ... | ... | ... | ... | ... | ... | ... | ... | ... | ... | ... | ... | ... | ... | ... | ... |
| 6 | ... | ... | ... | ... | ... | ... | ... | ... | ... | ... | ... | ... | ... | ... | ... | ... |
| 7 | ... | ... | ... | ... | ... | ... | ... | ... | ... | ... | ... | ... | ... | ... | ... | ... |
| 8 | ... | ... | ... | ... | ... | ... | ... | ... | ... | ... | ... | ... | ... | ... | ... | ... |
| 9 | ... | ... | ... | ... | ... | ... | ... | ... | ... | ... | ... | ... | ... | ... | ... | ... |
| A | ... | ... | ... | ... | ... | ... | ... | ... | ... | ... | ... | ... | ... | ... | ... | ... |
| B | ... | ... | ... | ... | ... | ... | ... | ... | ... | ... | ... | ... | ... | ... | ... | ... |
| C | ... | ... | ... | ... | ... | ... | ... | ... | ... | ... | ... | ... | ... | ... | ... | ... |
| D | ... | ... | ... | ... | ... | ... | ... | ... | ... | ... | ... | ... | ... | ... | ... | ... |
| E | ... | ... | ... | ... | ... | ... | ... | ... | ... | ... | ... | ... | ... | ... | ... | ... |
| F | ... | ... | ... | ... | ... | ... | ... | ... | ... | ... | ... | ... | ... | ... | ... | ... |
| 10 | ... | ... | ... | ... | ... | ... | ... | ... | ... | ... | ... | ... | ... | ... | ... | ... |
| 11 | ... | ... | ... | ... | ... | ... | ... | ... | ... | ... | ... | ... | ... | ... | ... | ... |
| 12 | ... | ... | ... | ... | ... | ... | ... | ... | ... | ... | ... | ... | ... | ... | ... | ... |
| 13 | ... | ... | ... | ... | ... | ... | ... | ... | ... | ... | ... | ... | ... | ... | ... | ... |
| 14 | ... | ... | ... | ... | ... | ... | ... | ... | ... | ... | ... | ... | ... | ... | ... | ... |
| 15 | ... | ... | ... | ... | ... | ... | ... | ... | ... | ... | ... | ... | ... | ... | ... | ... |
| 16 | ... | ... | ... | ... | ... | ... | ... | ... | ... | ... | ... | ... | ... | ... | ... | ... |
| 17 | ... | ... | ... | ... | ... | ... | ... | ... | ... | ... | ... | ... | ... | ... | ... | ... |
| 18 | ... | ... | ... | ... | ... | ... | ... | ... | ... | ... | ... | ... | ... | ... | ... | ... |
| 19 | ... | ... | ... | ... | ... | ... | ... | ... | ... | ... | ... | ... | ... | ... | ... | ... |
| 1A | ... | ... | ... | ... | ... | ... | ... | ... | ... | ... | ... | ... | ... | ... | ... | ... |
| 1B | ... | ... | ... | ... | ... | ... | ... | ... | ... | ... | ... | ... | ... | ... | ... | ... |
| 1C | ... | ... | ... | ... | ... | ... | ... | ... | ... | ... | ... | ... | ... | ... | ... | ... |
| 1D | ... | ... | ... | ... | ... | ... | ... | ... | ... | ... | ... | ... | ... | ... | ... | ... |
| 1E | ... | ... | ... | ... | ... | ... | ... | ... | ... | ... | ... | ... | ... | ... | ... | ... |
| 1F | ... | ... | ... | ... | ... | ... | ... | ... | ... | ... | ... | ... | ... | ... | ... | ... |

SEMICONDUCTOR DEVICE AND SEMICONDUCTOR STORAGE DEVICE

CROSS-REFERENCE TO RELATED APPLICATIONS

This application is a continuation of and claims benefit under 35 U.S.C. § 120 to U.S. application Ser. No. 17/988,081 filed Nov. 16, 2022, which is a continuation of and claims benefit under 35 U.S.C. § 120 to U.S. application Ser. No. 17/200,264, filed Mar. 12, 2021 (now U.S. Pat. No. 11,543,977), and claims the benefit of priority under 35 U.S.C. § 119 from Japanese Patent Application No. 2020-096429, filed Jun. 2, 2020, the entire contents of each of which are incorporated herein by reference.

FIELD

An embodiment described herein relates generally to a semiconductor device and a semiconductor storage device having a random number generator circuit.

BACKGROUND

A semiconductor device may be equipped with a random number generator circuit. For example, in a nonvolatile memory, such as a NAND flash memory, to improve reliability of data read from a memory cell, user data, being a write target, are randomized by using random numbers and, thereafter, are written into the memory cell. The user data are randomized with the random numbers to form uniform random numbers and hence, reliability against various defective modes of the memory cell is improved.

However, the conventional random number generator circuit has a limitation of the data size of random number sequence data to be generated, and has a large circuit scale.

BRIEF DESCRIPTION OF THE DRAWINGS

FIG. 4 is a view showing an example of a table of index data according to the first embodiment;

FIG. 5 is a view showing an example of a program indicating processing performed by each XorShift according to the first embodiment:

FIG. 7 is a view showing an example of a conversion table corresponding to a polynomial of each S-box according to the first embodiment;

FIG. 11 is a view showing an example of a conversion table corresponding to a first polynomial of an S-box_1 according to the second embodiment;

FIG. 12 is a view showing an example of a conversion table corresponding to a second polynomial of an S-box_2 according to the second embodiment;

FIG. 13 is a view showing an example of a conversion table corresponding to a third polynomial of an S-box_3 according to the second embodiment:

FIG. 14 is a view showing an example of a conversion table corresponding to a fourth polynomial of an S-box 4 according to the second embodiment:

FIG. 15 is a view showing an example of a table that defines ON states of respective switches corresponding to data Q according to the second embodiment;

FIG. 16 is a view showing an example of another table that defines ON states of the respective switches corresponding to bit strings of data Q according to a modification of the second embodiment;

FIG. 18 is a view showing an example of a conversion table for 7-bit conversion corresponding to a polynomial of two S-boxes, that is, an S-box_11 and an S-box_13, according to the third embodiment:

FIG. 19 is a view showing an example of a conversion table for 9-bit conversion corresponding to a polynomial of two S-boxes, that is, an S-box_12 and an S-box_14, according to the third embodiment;

DETAILED DESCRIPTION

A semiconductor device of an embodiment includes: a seed generator circuit configured to generate a seed from inputted data by using first random number sequence data generated by performing a first XorShift operation; and a random number generator circuit configured to receive the seed as input to generate second random number sequence data by performing a second XorShift operation.

Hereinafter, embodiments will be described with reference to drawings.

First Embodiment (Configuration of Memory System)

Figure 1:
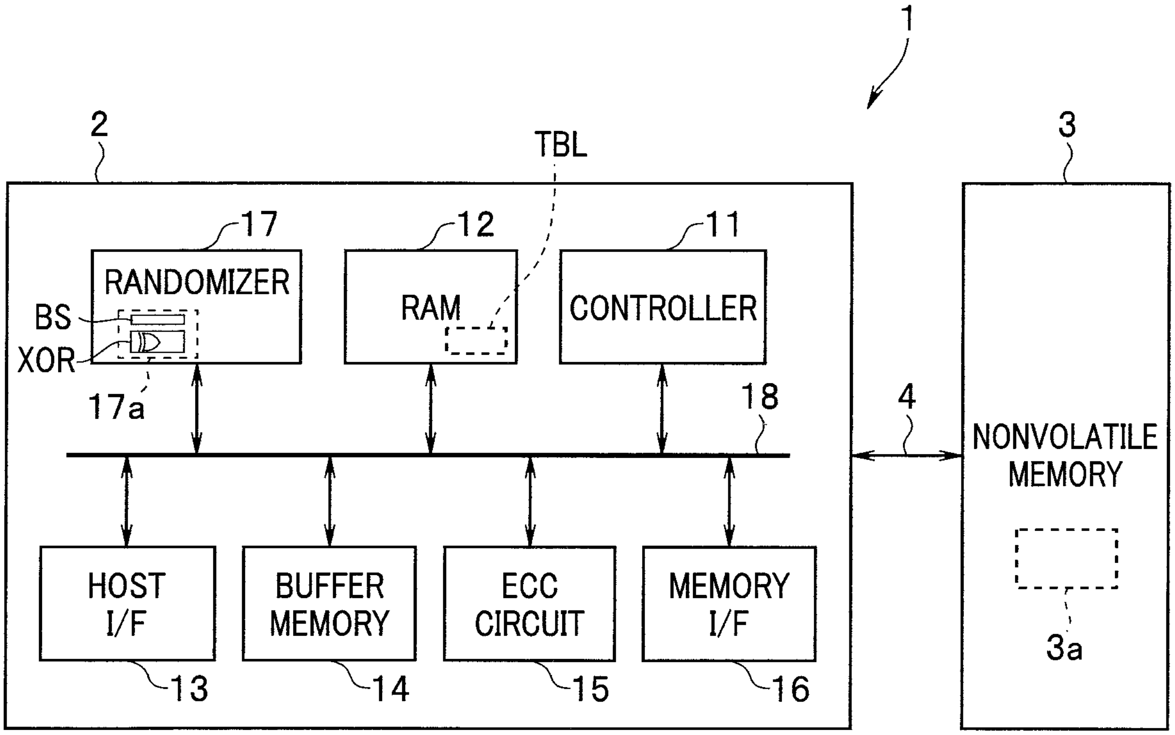
FIG. 1 is a block diagram schematically showing a constitutional example of a semiconductor storage device as a memory system according to a first embodiment.

FIG. 1 is a block diagram schematically showing a constitutional example of a semiconductor storage device as a memory system according to a first embodiment. As shown in FIG. 1, a semiconductor storage device 1 is configured such that a memory controller 2 and a nonvolatile memory 3 are connected with each other via a memory bus 4.

The nonvolatile memory 3 is a semiconductor memory that can store data in a nonvolatile manner. An example of the nonvolatile memory 3 may be a NAND flash memory (hereinafter also simply referred to as "NAND memory"). The nonvolatile memory 3 includes a memory cell array 3*a*, and the memory cell array 3*a* includes a block BLK including a plurality of nonvolatile memory cells that are caused to correspond to rows and columns. Note that the memory cell array 3*a* may include a plurality of blocks BLK. In this case, in the NAND memory, writing and reading of data are performed for each block BLK in predetermined units (in units of a page, for example). In other words, the nonvolatile memory 3 stores data at a storage location designated by a page number. Therefore, storage location data indicating the storage location of data in the nonvolatile memory 3 contains a page number, or the page number and a frame number (described later) contained in the page number.

Further, in the NAND memory, data are erased in units of the block BLK. In the case where the NAND memory is used for the nonvolatile memory 3, the memory cell of the nonvolatile memory 3 may be a single level cell that can store 1 bit, or may be a multi-level cell that can store 2 or more bits.

The memory controller 2 controls the writing of data into the nonvolatile memory 3 and the reading of data from the nonvolatile memory 3 in response to a request from a host being an external device, such as a personal computer or a mobile terminal. As shown in FIG. 1, the memory controller 2 has a configuration where a controller 11, a RAM (random access memory) 12, a host interface circuit (hereinafter referred to as "host I/F") 13, a buffer memory 14, an ECC (error check and correction) circuit 15, a memory interface circuit (hereinafter referred to as "memory I/F") 16, and a randomizer 17 are connected with each other via an internal bus 18.

The host I/F 13 outputs the request received from the host, written data (hereinafter referred to as "user data"), and the like to the internal bus 18. The host I/F 13 also transmits user data read from the nonvolatile memory 3, a response from the controller 11, and the like to the host.

The memory I/F 16 performs output processing and reception processing based on an instruction from the controller 11. In the output processing, various control signals and user data are outputted to write the user data into the nonvolatile memory 3. In the reception processing, user data from the nonvolatile memory 3 are received.

The controller 11 centrally controls the semiconductor storage device 1. An example of the controller 11 may be a CPU (central processing unit), an MPU (micro processing unit), or the like. When the controller 11 receives various requests from the host via the host I/F 13, the controller 11 controls respective units in the memory controller 2 in response to the received requests. For example, the controller 11 instructs the memory I/F 16 to perform writing of user data into the nonvolatile memory 3 in response to a data writing request from the host. The controller 11 also instructs the memory I/F 16 to perform reading of user data from the nonvolatile memory 3 in response to a data reading request from the host.

When the controller 11 receives a writing request from the host, user data received by the host I/F 13 from the host as written data are temporarily accumulated in the buffer memory 14. The controller 11 decides a storage area (that is, a storage location) in the nonvolatile memory 3 for the user data accumulated in the buffer memory 14, and instructs the memory I/F 16 to write the user data into the decided storage area.

In contrast, when the controller 11 receives a read request from the host, the controller 11 instructs the memory I/F 16 to perform reading of user data based on an address contained in the read request. The user data read from the nonvolatile memory 3 are temporarily accumulated in the buffer memory 14 and, thereafter, are transmitted to the host via the host I/F 13.

The buffer memory 14 temporarily stores user data and the like at the time of performing writing/reading of the user data into/from the nonvolatile memory 3. An example of the buffer memory 14 may be a volatile memory, such as an SRAM (static random access memory) or a DRAM (dynamic random access memory).

The ECC circuit 15 is an encoding/decoding circuit having an error correction function, for example. The ECC circuit 15 encodes user data to be written into the nonvolatile memory 3 with error correction code, such as BCH code. The ECC circuit 15 also decodes encoded user data read from the nonvolatile memory 3 to generate original user data.

The randomizer 17 randomizes user data to be written into the nonvolatile memory 3, and transmits the user data to the ECC circuit 15. The randomizer 17 includes a random number generation unit 17*a* that generates pseudorandom numbers such that data to be stored in the nonvolatile memory 3 become uniform random numbers. The random number generation unit 17*a* is configured to include a plurality of bit shift circuits BS, which perform bit shifting to perform XorShift processing, and a plurality of exclusive OR circuits (hereinafter abbreviated as "XORs"), which perform an XOR operation on respective bits. The configuration of the random number generation unit 17*a* will be described later.

When user data are written into the nonvolatile memory 3, the ECC circuit 15 encodes the randomized user data. Further, when user data are read from the nonvolatile memory 3, the user data are decoded by the ECC circuit 15 and, thereafter, are transmitted to the randomizer 17. The randomizer 17 derandomizes the randomized user data to restore original user data.

More specifically, in the case of the writing of data, when the semiconductor storage device 1 receives user data and address data from the host, the randomizer 17 of the memory controller 2 generates random number sequence data, which are pseudorandom numbers, based on the page number and the like in the nonvolatile memory 3, which is a write destination for user data. The randomizer 17 randomizes the user data by using the generated random number sequence data. The randomized user data are encoded in the ECC circuit 15, and are outputted from the memory controller 2 to the nonvolatile memory 3. The randomized user data are stored in a page that corresponds to an address designated by the address data from the host (a physical address of the nonvolatile memory 3 converted from a logical address of the host).

In the case of the reading of data, when the semiconductor storage device 1 receives address data from the host, the randomizer 17 generates random number sequence data, which are pseudorandom numbers, based on the page number and the like of the nonvolatile memory 3, which is a read destination for user data. The random number sequence data are uniquely decided according to the page number and the like. Therefore, in the case where the semiconductor storage device 1 receives two address data AD1, AD2 from the host, when address data AD1 and address data AD2 are equal, the page number and the like of the nonvolatile memory 3 in the address data AD1 and the page number and the like of the nonvolatile memory 3 in the address data AD2 are equal and hence, random number sequence data generated based on the address data AD1 and random number sequence data generated based on the address data AD2 match with each other.

The memory controller 2 reads randomized user data from the page of the nonvolatile memory 3 corresponding to the address designated by address data from the host, and decodes the randomized user data in the ECC circuit 15. The memory controller 2 derandomizes the randomized user data from the nonvolatile memory 3 by using the generated random number sequence data to restore original user data from the randomized user data, and outputs the restored user data to the host.

Note that a configuration may be adopted where user data are encoded in the ECC circuit 15, the encoded user data are randomized, and the randomized encoded data are then stored in the nonvolatile memory 3. In this case, in the reading of user data, the randomized data read from the nonvolatile memory 3 is derandomized and, thereafter, error collection is performed on the derandomized user data in the ECC circuit 15.

(Configuration of Nonvolatile Memory)

Figure 2:
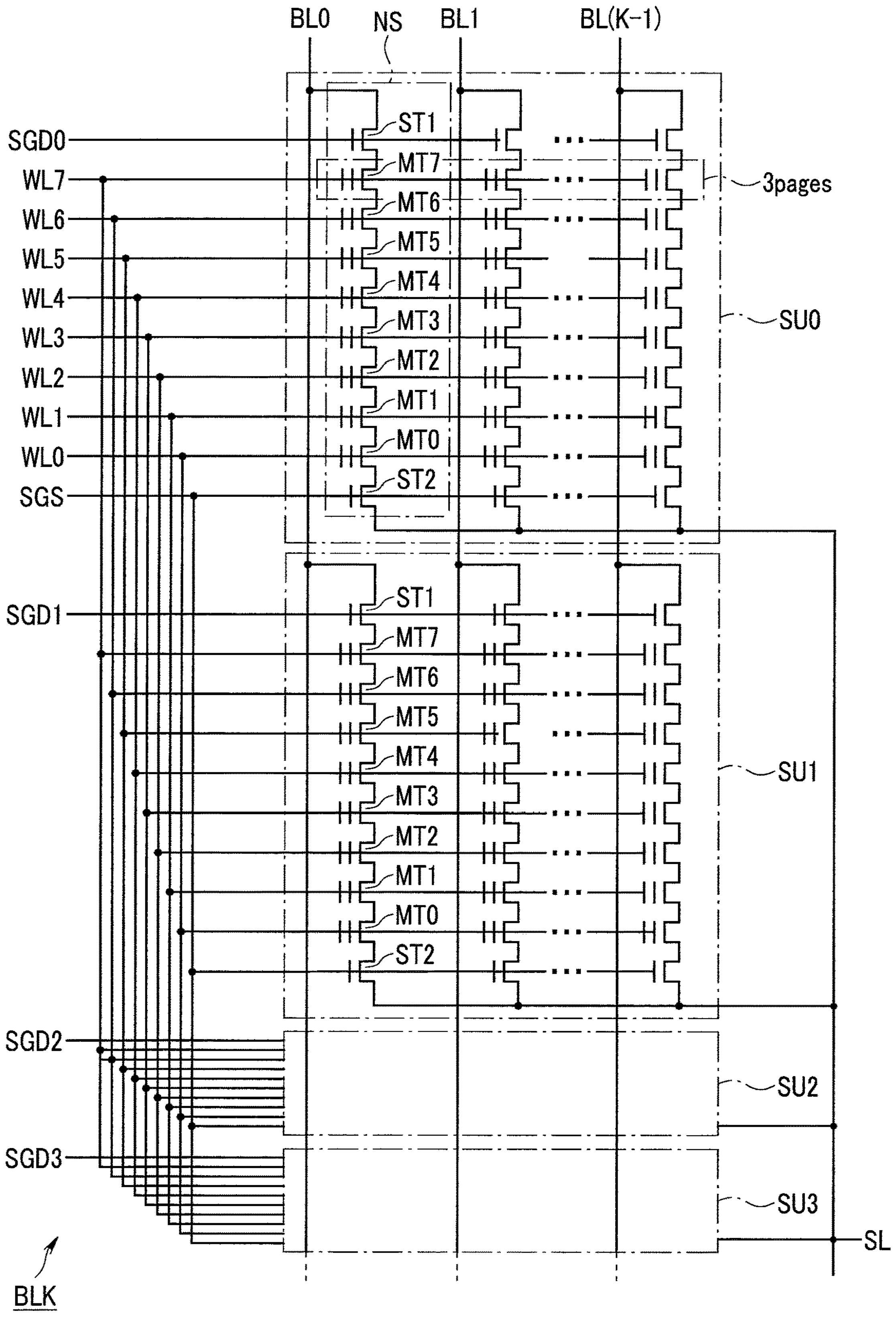
FIG. 2 is a circuit diagram for describing a configuration of a memory cell array of a nonvolatile memory according to the first embodiment.

Next, the configuration of the nonvolatile memory 3 will be described with reference to FIG. 2. FIG. 2 is a circuit diagram for describing the configuration of the memory cell array of the nonvolatile memory 3 according to the present embodiment. In the present embodiment, as shown in the drawing, one block BLK includes, for example, four string units SU (SU0 to SU3). Each string unit SU includes a plurality of NAND strings NS.

Each NAND string NS includes, for example, eight memory cell transistors MT (MT0 to MT7) and two selection transistors ST1, ST2. Each memory cell transistor MT includes a control gate and a charge accumulation layer to store data in a nonvolatile manner. The plurality of (eight, for example) memory cell transistors MT are connected in series between a source of the selection transistor ST1 and a drain of the selection transistor ST2. For the sake of simplicity of the description, FIG. 2 shows an example where one string unit SU includes eight word lines WL.

Gates of the selection transistors ST1 in the string units SU0 to SU3 are respectively connected to select gate lines SGD0 to SGD3. In contrast, gates of the selection transistors ST2 in the string units SU0 to SU3 are connected in common to a select gate line SGS, for example. Needless to say, the gates of the selection transistors ST2 in the string units SU0 to SU3 may be respectively connected to different select gate lines SGS0 to SGS3. Further, control gates of the memory cell transistors MT0 to MT7 in the same block BLK are connected in common to respective word lines WL0 to WL7.

Further, drains of the selection transistors ST1 of the plurality of NAND strings NS in the same column in the memory cell array 3*a* are connected in common to a bit line BL (BL0 to BL (K−1), "K" being a natural number of 2 or more). In the case where the memory cell array 3*a* includes a plurality of blocks BLK, the bit lines BL connect the plurality of NAND strings NS in common across the plurality of blocks BLK. Further, sources of the plurality of selection transistors ST2 are connected in common to a source line SL.

In other words, the memory cell array 3*a* is one block BLK where respective bit lines BL are connected in common, or is assembly of the plurality of blocks BLK. Further, each block BLK includes the plurality of string units SU that use the respective word lines WL in common. Each string unit SU includes the plurality of NAND strings NS which are connected to a plurality of different bit lines BL, and which are connected to the same select gate line SGD.

In addition to the memory cell array 3*a*, the nonvolatile memory 3 includes a row decoder, a driver circuit, a column decoder, an address register, a command register, a sequencer, and the like not shown in the drawing. The sequencer controls the action of the entire nonvolatile memory 3 based on a command stored by the command register to perform processing of writing data into the memory cell array 3*a* and processing of reading data from the memory cell array 3*a*.

In the present embodiment, one memory cell transistor MT can store 3-bit data, for example. In other words, the nonvolatile memory 3 is a semiconductor storage device of a so-called TLC (triple level cell) type. The 3-bit data are respectively referred to as "lower bit". "middle bit", and "upper bit" in order from the lower bit. A set including lower bits stored by the plurality of memory cell transistors MT connected to the same word line WL in one string unit is referred to as "lower page". A set including middle bits stored by the plurality of memory cell transistors MT connected to the same word line WL in one string unit is referred to as "middle page". A set including upper bits stored by the plurality of memory cell transistors MT connected to the same word line WL in one string unit is referred to as "upper page". The plurality of memory cell transistors MT connected to one word line in one string unit constitutes one page unit that stores lower, middle, and upper bits. In other words, three pages are allocated to each page unit. The writing of data is performed in units of a page, and the reading of data is performed for each page.

(Configuration of Randomizer)

Figure 3:
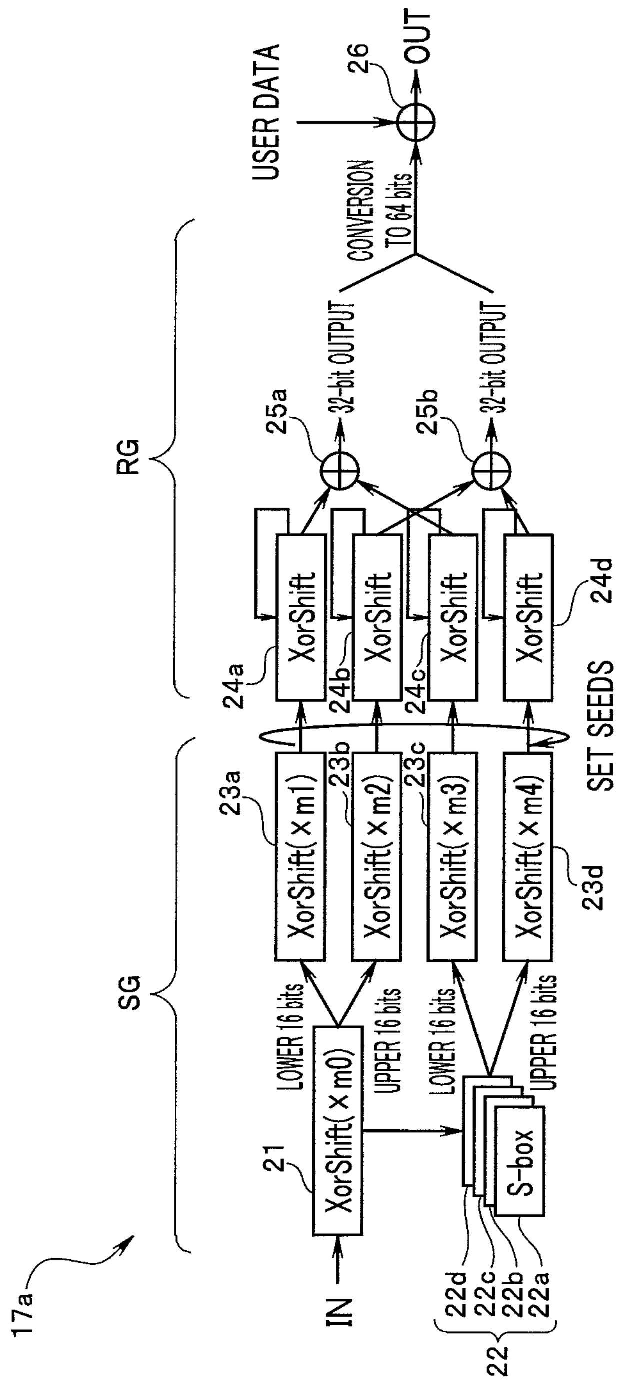
FIG. 3 is a block diagram showing a configuration of a randomizer according to the first embodiment.

FIG. 3 is a block diagram showing a configuration of the randomizer 17. The randomizer 17 is a circuit that generates pseudorandom numbers (hereinafter also simply referred to as "random numbers") to randomize data. The memory controller 2 randomizes user data by using random number sequence data generated by the randomizer 17, and stores the randomized user data in the nonvolatile memory 3.

As described above, the randomizer 17 includes the random number generation unit 17*a* including XorShifts. In the present embodiment, each XorShift included in the random number generation unit 17*a* is an XorShift32 circuit that generates 32-bit random number sequence data. Each XorShift includes a plurality of XORs that perform an XOR operation, and a plurality of bit shift circuits BS. In the present embodiment, the randomizer 17 randomizes user data for every 64 bits.

As shown in FIG. 3, the random number generation unit 17*a* includes a seed generator circuit SG and a random number generator circuit RG. The seed generator circuit SG generates a seed from inputted data by using first random number sequence data generated by the XorShift operation. The random number generator circuit RG receives the seed as input to generate second random number sequence data by the XorShift operation. In other words, the seed generator circuit SG generates a seed by the XorShift operation, and the random number generator circuit RG generates random number sequence data from the generated seed by the XorShift operation.

The seed generator circuit SG includes a plurality of (five in the present embodiment) XorShifts 21, 23*a*, 23*b*, 23*c*, 23*d*, and an S-box unit 22 including a plurality of (four in the present embodiment) S-boxes 22 (22*a*, 22*b*, 22*c*, 22*d*). Hereinafter, all or each of the four S-boxes 22*a*, 22*b*, 22*c*, 22*d* is abbreviated as "S-box 22", and all or each of four XorShits 23*a*, 23*b*, 23*c*, 23*d* is abbreviated as "XorShift 23". Each S-box 22 is a nonlinear transformation circuit that performs a nonlinear transformation on inputted data. In other words, the seed generator circuit SG includes the plurality of XorShifts 23, and at least one S-box 22 that performs the nonlinear transformation on output data from at least one of the plurality of XorShifts 23. A seed being random number sequence data is generated by using the plurality of XorShifts 23 and at least one S-box 22.

The seed generator circuit SG includes the plurality of (five in the present embodiment) XorShift circuits. However, in the case where a plurality of XorShift operations are performed in the predetermined order, the seed generator circuit SG may include one, two, or three XorShift circuits.

The random number generator circuit RG is a circuit including a plurality of (four in the present embodiment) XorShifts 24*a*, 24*b*, 24*c*. 24*d*, and a plurality of (two in the present embodiment) XORs 25*a*, 25*b*.

In the present embodiment, the seed generator circuit SG uses the plurality of S-boxes 22 to further eliminate linearity or periodicity of random number sequence data to be generated. However, the seed generator circuit SG may not include the plurality of S-boxes 22.

In FIG. 3, the randomizer 17 includes nine XorShifts. However, when the order of operation is considered, an XorShift operation equivalent to the XorShift operation performed by the nine XorShifts can be achieved with a smaller number of XorShifts.

A storage destination address of data designated by the host is a logical address. In the memory controller 2, the logical address is converted to the physical address of the nonvolatile memory 3 to perform the writing and reading of data. The physical address corresponds to a page (or, as will be described later, the page and a frame number in the page) of the memory cell array 3*a*. Therefore, the memory controller 2 performs the writing and reading of data by designating the page of the memory cell array 3*a*.

For example, the writing of data into the memory cell array 3*a* is performed in units of a page, and the reading of data from the memory cell array 3*a* is performed in units of a page.

Note that processing of writing and reading user data may be performed in units of a divided page, which is obtained by dividing one page in predetermined units, that is, performed in units of a frame. In this case, a physical address corresponds to the page of the memory cell array 3*a* and a frame in the page.

In the present embodiment described hereinafter, the description will be made for the case where the memory controller 2 divides one page into a plurality of (four in the present embodiment) frames, and performs the writing and reading of data in units of the divided frame.

An index set in advance corresponding to address data from the host is inputted to the seed generator circuit SG. The index is an index number in the present embodiment. As will be described later, the index number is set in advance corresponding to a page and a frame indicating a storage destination address in the nonvolatile memory 3. The index number corresponds to a storage destination address (that is, a storage location) in the nonvolatile memory 3. Therefore, the seed generator circuit SG generates a seed, being random number sequence data generated by using the XorShift operation, from storage location data (the page and the frame) indicating a storage location of data in the nonvolatile memory 3.

FIG. 4 is a view showing an example of a table TBL of index data. The table TBL is read from the predetermined storage area of the nonvolatile memory 3 at the time of starting up a memory system, and is held in the RAM 12.

For example, when one page has 16 KB of data, 16 KB of data on the one page are divided into four frames. Each frame has 4 KB of data. The table TBL is a table that stores index numbers IN corresponding to pages (L, M, U) of each word line WL, and frames (Frame0, Frame1, Frame2, Frame3) of each string unit SU.

In FIG. 4, the index numbers IN are set corresponding to the pages of each word line WL and the frames of each string unit in each of the four string units SU0 (String 0) to SU3 (String 3). For example, 96 word lines WL are provided, and three pages consisting of an upper page, a middle page, and a lower page are allocated to each word line WL.

When the controller 11 of the memory controller 2 receives a data writing or reading request from the host, the controller 11 identifies the page and the frame of the memory cell array 3*a* from address data relating to the request from the host. The controller 11 extracts, from the identified page and frame, the index number IN that corresponds to the identified page and frame by reference to the table TBL in the RAM 12, and the controller 11 supplies the index number IN to the randomizer 17.

As shown in FIG. 3, the index number IN is inputted to an XorShift 21 as binary data. The XorShift 21 generates random number sequence data based on the index number IN. Thereafter, the XorShift 21 performs a second round of generating random number sequence data based on the generated random number sequence data. Thereafter, the XorShift 21 further performs a third round of generating random number sequence data based on the generated random number sequence data. In other words, the XorShift 21 does not output random number sequence data generated based on the index number IN, but performs the generation of random number sequence data based on the generated random number sequence data, and then further performs the generation of random number sequence data based on the generated random number sequence data. In other words, the XorShift 21 performs the generation of random number sequence data over three cycles. The XorShift 21 does not output the generated random number sequence data in the first two cycles, but outputs the random number sequence data generated in the third round. Specifically, the XorShift 21 performs the idling of generating random number sequence data two times and, thereafter, outputs random number sequence data generated in the third round.

In FIG. 3, m0, m1 to m4 in the respective XorShifts indicate the number of rounds of generating the random number sequence data. Therefore, m0 in the XorShift 21 is 3. Note that m0=3 is one example.

According to the test performed by the applicant, in the present embodiment, each XorShift processes 32-bit data and hence, sufficient amount of random number sequence data can be generated by performing the idling or the generation of random number data two times or three times.

In the present embodiment, data processed by each XorShift are 32-bit data and hence, the idling is performed two or three times. However, when the number of bits of data processed by each XorShift changes, the number of times of the idling also changes.

Figure 6:
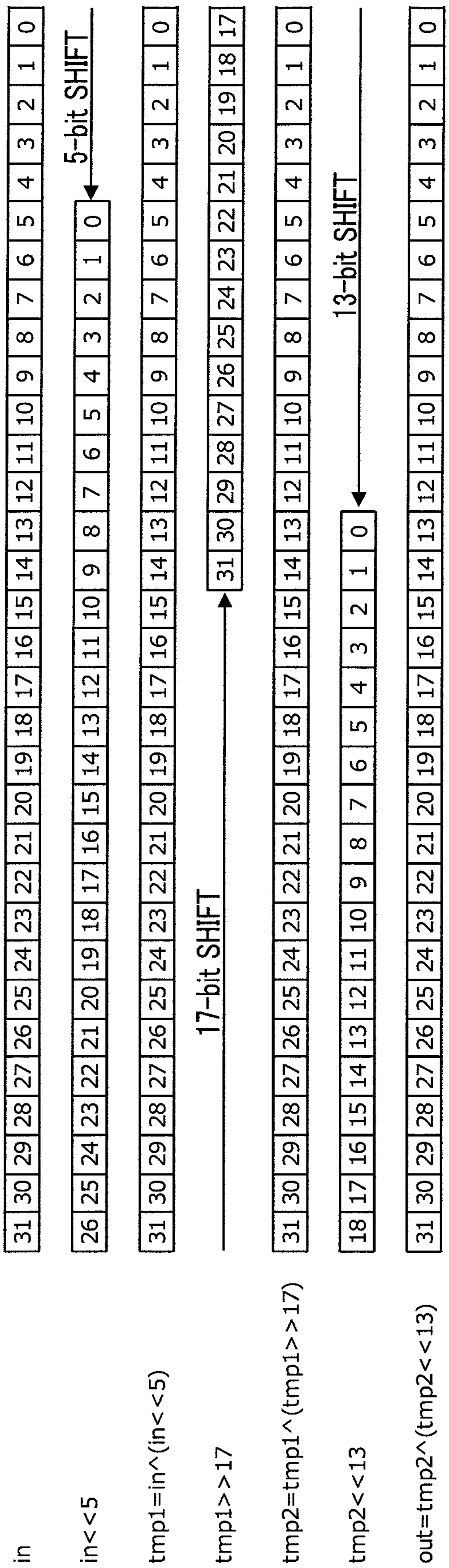
FIG. 6 is a view showing a change in position of data, the change indicating a processing content where input data in are processed by the XorShift32, thus generating output data out according to the first embodiment.

FIG. 5 is a view showing an example of a program indicating processing performed by each XorShift. FIG. 6 is a view showing a change in position of data, the change indicating a processing content where input data in are processed by the XorShift32, thus generating output data out.

As shown in FIG. 5 and FIG. 6, the XorShift performs bit shift processing of shifting 32-bit input data in to the left by 5 bits, and calculates XOR of shift data of the input data in shifted to the left by 5 bits (in<<5) and the original input data in to obtain output data tmp1.

For example, in the case where the index number IN, being input data, is represented as 16-bit data, for example, sixteen "0"s are added to the upper bit of the index number IN to be converted to 32-bit data, and the 32-bit data are inputted to the randomizer 17.

Next, the XorShift performs bit shift processing of shifting the 32-bit output data tmp1 to the right by 17 bits, and calculates XOR of shift data of the output data tmp1 shifted to the right by 17 bits (tmp1>>17) and the original output data tmp1 to obtain output data tmp2.

The XorShift further performs bit shift processing of shifting the 32-bit output data tmp2 to the left by 13 bits, calculates XOR of the output data tmp2 shifted to the left by 13 bits (tmp2<<13) and the original output data tmp2 to obtain output data out, and outputs the output data out.

The four S-boxes 22*a*, 22*b*, 22*c*, 22*d* and two XorShifts 23*a*, 23*b* receive a supply of the 32-bit output out.

Each S-box 22 is a circuit which outputs an 8-bit output in response to an 8-bit input, and performs a nonlinear transformation using the irreducible polynomial of Rijndael conforming with AES (advanced encryption standard). Each S-box 22 includes a table that performs inverse transformation of input data by Galois field GF(256) arithmetic, and performs nonlinear transformation processing. The four S-boxes 22*a*, 22*b*, 22*c*, 22*d* are provided to simultaneously convert 32-bit data. In the present embodiment, each S-box 22 performs a nonlinear transformation in response to input of 1-byte data, and outputs 1-byte data. With the use of the four S-boxes 22*a*, 22*b*. 22*c*, 22*d*, 32-bit random number sequence data are generated and outputted. FIG. 7 is a view showing an example of a conversion table corresponding to the polynomial of each S-box 22.

As described above, 32-bit output (random number sequence data) from the XorShift 21 are inputted to the four S-boxes 22*a*, 22*b*, 22*c*, 22*d*, and data for every 8 bits of 32 bits are inputted to the four S-boxes 22*a*, 22*b*, 22*c*, 22*d*. More specifically, most significant 8-bit data are inputted to the S-box 22*a*, 8-bit data on the lower side of the most significant 8 bits are inputted to the S-box 22*b*, 8-bit data on the upper side of the least significant 8 bits are inputted to the S-box 22*c*, and least significant 8-bit data are inputted to the S-box 22*d*.

As described above, the S-boxes are used to cause an effect of nonlinearity brought about by the S-boxes in the random number generation unit 17*a*. Outputs from the S-box unit 22 are inputted to the XorShifts 23*c*, 23*d*, and outputs from the XorShifts 23*c*, 23*d* are supplied to the random number generator circuit RG in a state of being used as the part of seeds.

Lower 16-bit data of the 32-bit output from the XorShift 21 are inputted to the XorShift 23*a*, and upper 16-bit data of the 32-bit output from the XorShift 21 are inputted to the XorShift 23*b*.

The XorShift 23*a* performs the generation of random number sequence data m1 times (m1=4 in the present embodiment) by using the lower 16-bit data of the output from the XorShift 21 to generate 32-bit output data. The XorShift 23*b* also performs the generation of random number sequence data m2 times (m2=4 in the present embodiment) by using the upper 16-bit data of the output from the XorShift 21 to generate 32-bit output data.

Lower 16-bit data of the S-box unit 22 are inputted to the XorShift 23*c*, and upper 16-bit data of the S-box unit 22 are inputted to the XorShift 23*d*.

The XorShift 23*c* performs the generation of random number sequence data m3 times (m3=4 in the present embodiment) by using the lower 16-bit data of the S-box unit 22 to generate 32-bit output data. The XorShift 23*d* also performs the generation of random number sequence data m4 times (m4=4 in the present embodiment) by using the upper 16-bit data of the S-box unit 22 to generate 32-bit output data.

Four output data from the four XorShifts 23*a*, 23*b*, 23*c*, 23*d* are respectively supplied to four XorShifts 24*a*, 24*b*. 24*c*, 24*d* of the random number generator circuit RG as seeds. More specifically, the 32-bit output data from the XorShift 23*a* are supplied to the XorShift 24*a*, the 32-bit output data from the XorShift 23*b* are supplied to the XorShift 24*b*, the 32-bit output data from the XorShift 23*c* are supplied to the XorShift 24*c*, and the 32-bit output data from the XorShift 23*d* are supplied to the XorShift 24*d*.

As described above, the plurality of XorShifts of the seed generator circuit SG include the XorShift 21 and the plurality of XorShifts 23. The XorShift 21 performs the XorShift operation on inputted data. The plurality of XorShifts 23 generate seeds by processing output data from both the XorShift 21 and the nonlinear transformation circuit (S-box).

In the present embodiment, 32-bit output data from the XorShift 21 are directly divided into 16 bits on the upper side and 16 bits on the lower side, and the 16 bits on the upper side and the 16 bits on the lower side are respectively supplied to the XorShifts 23*a*, 23*b*. However, a configuration may be adopted where the 32-bit output data from the XorShift 21 are separated into even-numbered data and odd-numbered data, and the even-numbered data and the odd-numbered data are respectively supplied to the XorShifts 23*a*, 23*b*.

The random number generator circuit RG receives the seeds from the seed generator circuit SG as input, and generates random number sequence data by performing the XorShift operation on the seeds. Each of the four XorShifts 24*a*. 24*b*, 24*c*, 24*d* of the random number generator circuit RG performs the generation of random number sequence data from the inputted 32-bit data, and outputs output data. In each XorShift 24, random number sequence data obtained by performing the XorShift operation is outputted the predetermined number of times, which is the number of times obtained by dividing the data length (the number of bits) of user data to be scrambled by 64.

As shown in FIG. 3, output data from the XorShift 24*a* and output data from the XorShift 24*c* are supplied to the XOR 25*a*. The XOR 25*a* calculates XOR of the output data from the XorShift 24*a* and the output data from the XorShift 24*c* for each bit, and outputs 32-bit output data. Each of the XorShift 24*a* and the XorShift 24*c* outputs output data a predetermined number of times. Each time the output data are outputted, the XOR 25*a* outputs the result of the XOR operation of the output data from the XorShift 24*a* and the output data from the XorShift 24*c* for each bit.

In the same manner, output data from the XorShift 24*b* and output data from the XorShift 24*d* are supplied to the XOR 25*b*. The XOR 25*b* calculates XOR of the output data from the XorShift 24*b* and the output data from the XorShift 24*d* for each bit, and outputs 32-bit output data. Each of the XorShift 24*b* and the XorShift 24*d* outputs output data a predetermined number of times. Each time the output data are outputted, the XOR 25*b* outputs the result of the XOR operation of the output data from the XorShift 24*b* and the output data from the XorShift 24*d* for each bit.

Two 32-bit output data from the XORs 25*a*, 25*b* are concatenated to be converted to 64 bits, and are outputted to an XOR 26 as a random number sequence data output from the random number generator circuit RG.

As described above, the random number generator circuit RG performs the XOR operation on the operation results from the plurality of XorShifts 24 to generate random number sequence data.

Figure 8:
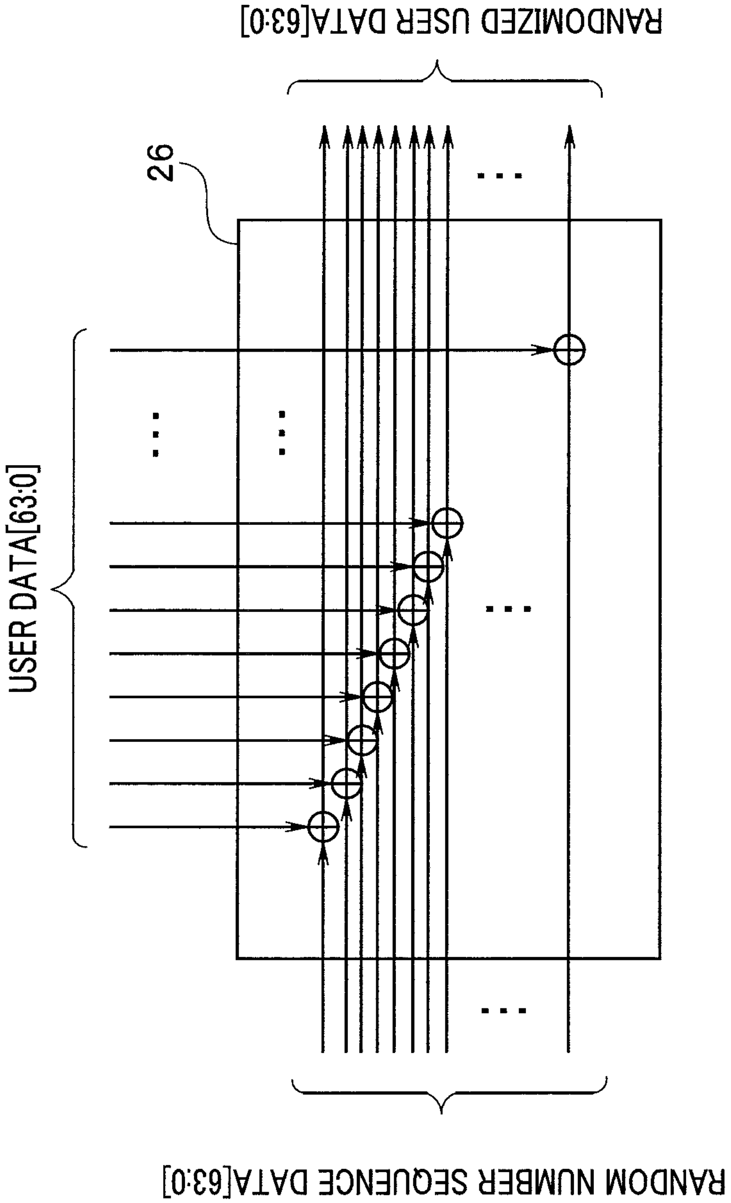
FIG. 8 is a circuit diagram of an exclusive OR circuit (XOR) according to the first embodiment.

FIG. 8 is a circuit diagram of the XOR 26. The XOR 26 receives 64-bit data in user data and 64-bit data from the two XORs 25*a*, 25*b* as input, and outputs 64-bit output data OUT obtained by performing the XOR operation on each bit. The output data OUT are user data obtained by randomizing 64-bit user data with random number sequence data generated in the random number generator circuit RG.

The randomizer 17 divides user data for every 64 bits, and the XOR 26 generates output data OUT obtained by calculating XOR of user data and random number sequence data in units of 64 bits in each cycle. In other words, the XOR 26 generates and outputs the operation result from the XOR operation for each cycle.

Therefore, the XorShifts 24*a* to 24*d* are operated to output the same output data to the XORs 25*a*, 25*b* by a predetermined number of times, which is the number of times obtained by dividing the number of bits of user data by 64 bits. For example, when one frame has 4 KB data, the predetermined number of times is 32000/64.

As a result, when user data are written into the nonvolatile memory 3, the user data are scrambled (that is, randomized) by using random number sequence data calculated based on an address, and are held in the nonvolatile memory 3. When user data are read from the nonvolatile memory 3, randomized user data from the nonvolatile memory 3 are descrambled by using the random number sequence data calculated based on the address to be restored to the original user data. The random number sequence data are generated based on the address and hence, the random number sequence data generated at the time of performing writing and the random number sequence data generated at the time of performing reading are equal. Therefore, random number sequence data equal to the random number sequence data generated at the time of performing writing are generated again also at the time of performing reading.

As described above, according to the present embodiment, random number sequence data are generated by performing the XorShift operation and hence, it is possible to achieve high extensibility of the data size of random number sequence data generated by the random number generator circuit and a reduction in the circuit scale of the random number generator circuit.

For example, in the case of CRC32, a random number period is $(2^{32}-1)$. The address space of a nonvolatile memory, such as a NAND memory may run out of a random number space in future using the CRC32. However, according to the above-mentioned embodiment, extensibility of the data size of random number sequence data is high and hence, it is possible to achieve a longer random number period and high random number performance.

Particularly, in the present embodiment, the randomizer 17 generates random number sequence data by using the index number IN allocated according to a page, a frame, and the like as input data. Therefore, it is unnecessary for the randomizer 17 to include a seed table.

In the case where a random number generator which uses a known linear feedback shift register (LFSR), or the CRC32 is mounted on a semiconductor memory, a limitation is imposed on the number of bits outputted in one cycle. However, according to the present embodiment, it is possible to increase the number of bits outputted in one cycle and hence, it is possible to achieve a randomizer having high extensibility of a data size. Further, in the case of a lagged-fibonacci random number generator, a large number of bits are required for initialization and hence, the circuit scale of an initialization circuit is increased. However, in the case of the present embodiment, it is possible to reduce the circuit scale of the initialization circuit.

In the above-mentioned random number generator circuit RG, four output data (seeds) from the four XorShifts 23*a*. 23*b*, 23*c*, 23*d* are supplied to the four XorShifts 24*a*, 24*b*, 24*c*, 24*d*, and the two XORs 25*a*. 25*b* perform the XOR operation of output data from the four XorShifts 24*a*, 24*b*, 24*c*, 24*d* to obtain two pieces of 32-bit output data. The two pieces of 32-bit output data are concatenated to generate final 64-bit random number sequence data. However, a configuration may be adopted where two XORs perform exclusive OR on four output data from the four XorShifts 23*a*, 23*b*, 23*c*, 23*d* to obtain two pieces of 32-bit output data, and the two pieces of 32-bit output data are inputted to two XorShifts to obtain two pieces of 32-bit output data.

Figure 9:
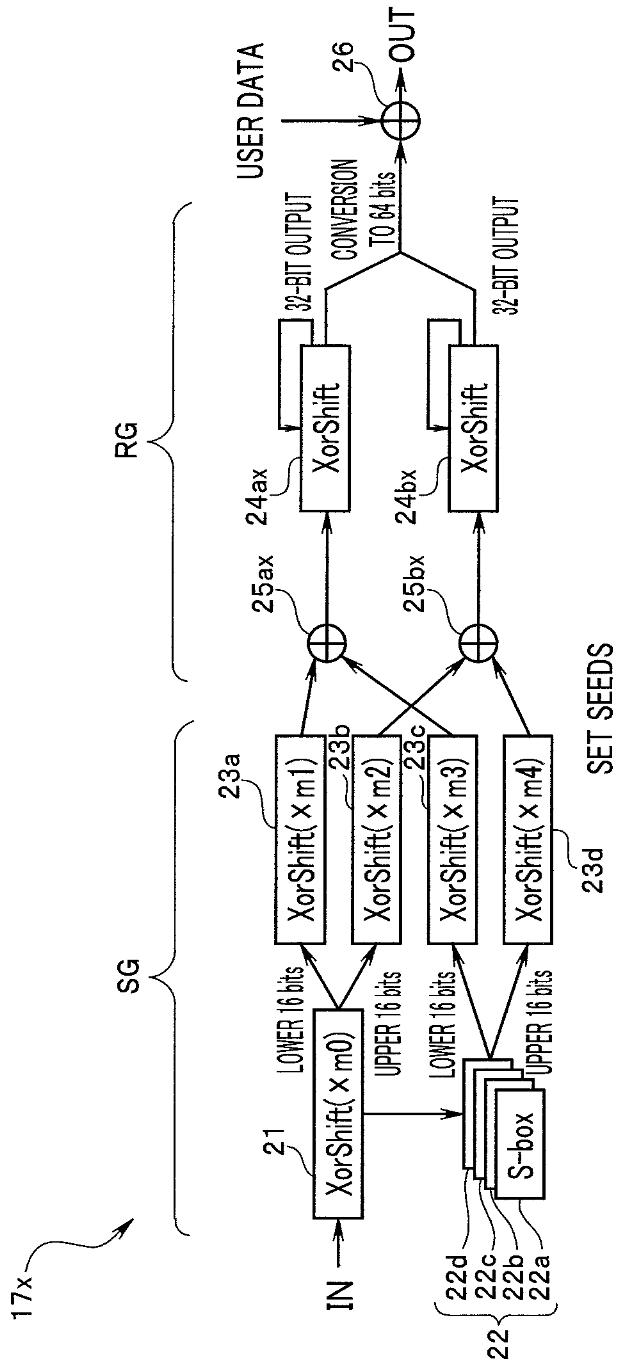
FIG. 9 is a block diagram showing a configuration of a randomizer according to a modification of the first embodiment.

FIG. 9 is a block diagram showing the configuration of a randomizer 17*x* according to a modification of the present embodiment. As shown in FIG. 9, in a random number generator circuit RG of the randomizer 17*x*, an XOR 25*ax* performs the XOR operation of two pieces of output data from two XorShifts 23*a*, 23*c* to obtain one piece of 32-bit output data, and the one piece of 32-bit output data is supplied to an XorShift 24*ax*. An XOR 25*bx* performs the XOR operation of two pieces of output data from two XorShifts 23*b*, 23*d* to obtain one piece of 32-bit output data, and the one piece of 32-bit output data is supplied to an XorShift 24*bx*. Two pieces of output data from the two XorShifts 24*ax*, 24*bx* are concatenated to generate final 64-bit random number sequence data.

In other words, the random number generator circuit RG performs the XOR operations on the operation results from the plurality of XorShifts 23, and performs XorShift on the operation results from the XOR operations to generate random number sequence data.

According to the present modification, the scale of the circuit for the XorShifts of the random number generator circuit RG is halved in the randomizer 17*x* and hence, the configuration is simplified compared with the configuration of the randomizer 17, and it is possible to obtain advantageous effects substantially equivalent to the advantageous effects of the first embodiment.

Further, in the above-mentioned embodiment, each XorShift uses the XorShift32 having the same bit shift amount, and the XORs 25*a*, 25*b* include 32-bit input and output. However, an XorShift other than the above-mentioned XorShift32 may be used.

For example, a plurality of XorShifts having different bit shift amounts may be used as the plurality of XorShifts. Alternatively, although bit data which are not used are generated, an XorShift which handles data having a larger bit width, such as an XorShift48 or an XorShift55, may be used. Alternatively, a configuration may be adopted where a plurality of XorShifts which handle data having a small bit width, such as an XorShift8, an XorShift16, or an XorShift24, are used in combination.

Second Embodiment

The seed generator circuit SG of the first embodiment uses the plurality of (four in the above-mentioned embodiment) S-boxes, each of which performs the same nonlinear transformation processing. However, in a second embodiment, a seed generator circuit SG uses a plurality of S-boxes that perform different nonlinear transformations. In other words, the nonlinear transformation circuit of the first embodiment includes the plurality of S-boxes that perform the nonlinear transformation of the same kind. However, the nonlinear transformation circuit of the second embodiment includes the plurality of S-boxes that perform a plurality of kinds of different nonlinear transformations.

The configurations of a semiconductor device, a memory controller, and a randomizer of the second embodiment are substantially equivalent to the configurations of the semiconductor storage device 1, the memory controller 2, and the randomizer 17 of the above-mentioned first embodiment (including the modification) and hence, the repeated description will be omitted. The same constitutional elements are given the same reference symbols and the repeated description will be omitted, and the description will be made only for the configuration which makes the present embodiment different from the first embodiment.

Figure 10:
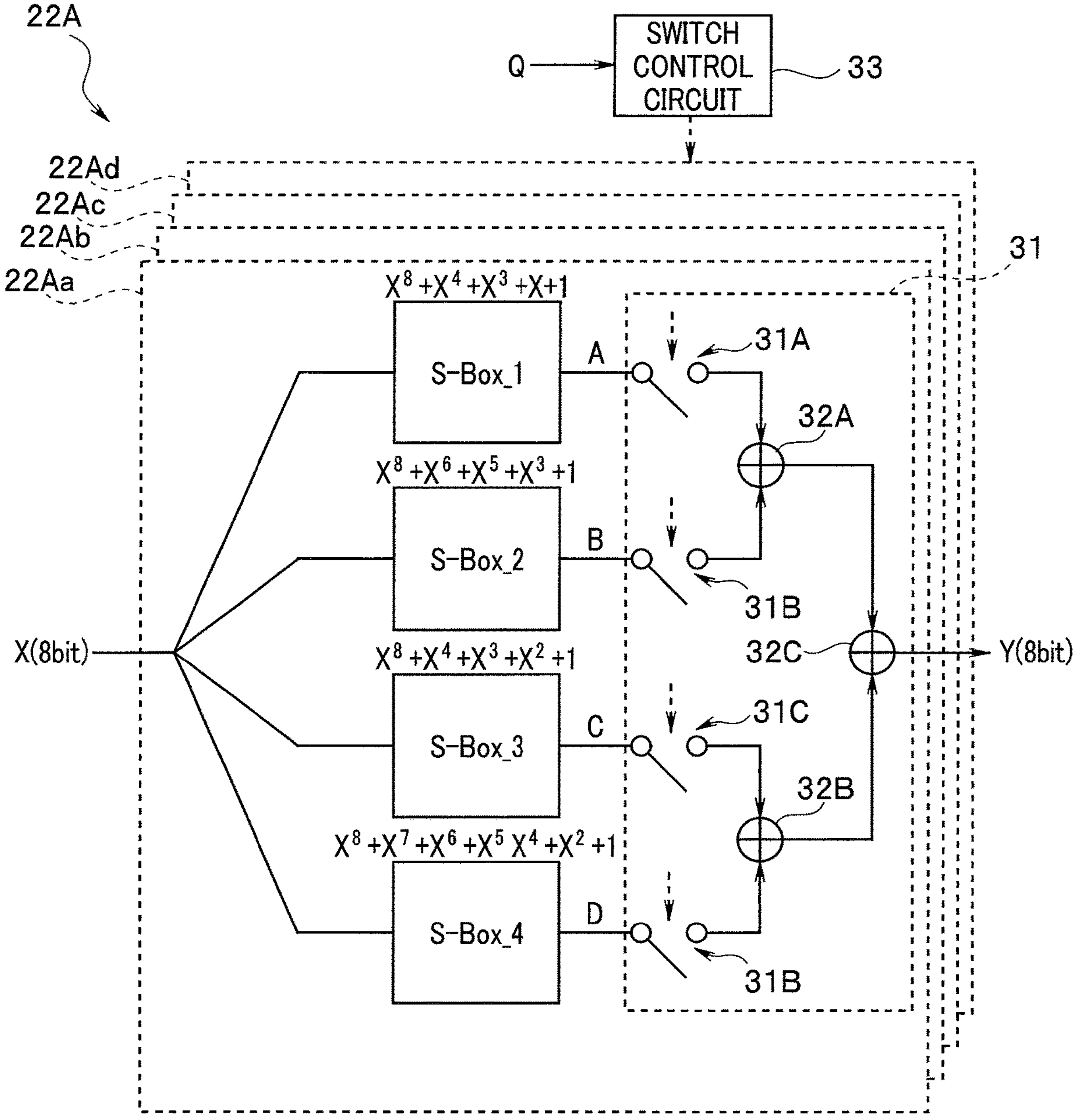
FIG. 10 is a configuration diagram of an S-box unit of a seed generator circuit of a randomizer according to a second embodiment.

FIG. 10 is a configuration diagram of an S-box unit 22A of the seed generator circuit SG of the randomizer 17 according to the present embodiment. The S-box unit 22A includes a plurality of (four in the present embodiment) sub-S-box units 22Aa to 22Ad. Each of the sub-S-box units 22Aa to 22Ad includes a plurality of (four in the present embodiment) S-box_1 to S-box_4. The plurality of sub-S-box units 22Aa to 22Ad are provided to the seed generator circuit SG in place of the respective S-boxes 22*a* to 22*d* shown in FIG. 3. In other words, the seed generator circuit SG includes the four S-box units 22A shown in FIG. 10. The S-box_1 to the S-box 4 perform a nonlinear transformations, each using a different polynomial.

The four S-box units 22A receive 32-bit data from the XorShift 21 as input. Each S-box unit 22A receives, as input, 8-bit data of 32-bit data from the XorShift 21. In other words, every 8 bits of 32-bit data from the XorShift 21 are inputted in order from the upper bit.

The S-box_1 performs a nonlinear transformation by a first polynomial ($x^8+x^4+x^3+x+1$). The S-box_2 performs a nonlinear transformation by a second polynomial ($x^8+x^6+x^5+x^3+1$). The S-box_3 performs a nonlinear transformation by a third polynomial ($x^8+x^4+x^3+x^2+1$). The S-box_4 performs a nonlinear transformation by a fourth polynomial ($x^8+x^7+x^6+x^5+x^4+x^2+1$).

FIG. 11 is a view showing an example of a conversion table corresponding to the first polynomial of the S-box_1. FIG. 12 is a view showing an example of a conversion table corresponding to the second polynomial of the S-box_2. FIG. 13 is a view showing an example of a conversion table corresponding to the third polynomial of the S-box_3. FIG. 14 is a view showing an example of a conversion table corresponding to the fourth polynomial of the S-box_4.

As shown in FIG. 10, an output from the S-box unit 22A is supplied to a switching unit 31. The switching unit 31 includes switches 31A, 31B, 31C, 31D that respectively correspond to the four S-boxes, that is, the S-box_1 to the S-box_4. The switching unit 31 also includes an XOR 32A, an XOR 32B, and an XOR 32C. The XOR 32A performs the XOR operation of outputs from the switches 31A, 31B. The XOR 32B performs the XOR operation of outputs from the switches 31C, 31D. The XOR 32C performs the XOR operation of the output from the XOR 32A and the output from the XOR 32B, and outputs output data Y.

Inputs of the switches 31A to 31D are respectively connected to the S-box_1 to the S-box_4. ON/OFF of each of the switches 31A to 31D is controlled based on switch control signals from a switch control circuit 33 such that the output data Y obtained by performing a predetermined nonlinear transformation on input data X are outputted.

The switch control circuit 33 outputs predetermined switch control signals to the respective switches 31A to 31D based on lower 4-bit data Q of 32-bit data outputted from the XorShift 21. Switching between ON and OFF of each of the switches 31A to 31D is performed based on a predetermined rule.

FIG. 15 is a view showing an example of a table TBL1 that defines the ON state of each of the switches 31A to 31D corresponding to the data Q. Based on the table TBL1, the switch control circuit 33 controls each of the switches 31A to 31D to be brought into an ON state depending on whether each of 4 bits is 1. The table TBL1 shows that when the least significant bit Q[0] is 1, the switch 31A is turned on so as to output an output A from the S-Box_1. In other words, the ON/OFF states of the respective switches 31A to 31D are allocated to respective bits of the lower 4-bit data Q of 32-bit data outputted from the XorShift 21.

The four S-box units 22A respectively output predetermined switch control signals to the switches 31A to 31D based on the lower 4-bit data Q with respect to corresponding 8-bit data of 32-bit data outputted from the XorShift 21 in the same manner. Therefore, it is possible to further increase nonlinearity of seeds to be generated.

In the above-mentioned example, the ON/OFF states of the respective switches 31A to 31D are allocated to the respective bits of the lower 4-bit data Q of the 32-bit data outputted from the XorShift 21. However, a configuration may be adopted where combinations of the ON/OFF states of the respective switches 31A to 31D are allocated corresponding to a data sequence of the data Q.

FIG. 16 is a view showing an example of another table TBL2 that defines ON states of the respective switches 31A to 31D corresponding to bit strings of the data Q according to a modification of the second embodiment. Based on the table TBL2, the switch control circuit 33 controls the respective ON states of the four switches 31A to 31D corresponding to a combination of 4 bits, that is, a bit string. The table TBL2 shows that, for example, when the 4-bit data Q have a data sequence [0000], only the switch 31A is turned on, while when the 4-bit data Q have a data sequence [1010], the switches 31A, 31B, 31C are turned on. In other words, the ON/OFF states of the respective switches 31A to 31D are allocated corresponding to the combination of the lower 4-bit data Q of the 32-bit data outputted from the XorShift 21.

Even with the use of the table TBL2 shown in FIG. 16, it is possible to further increase nonlinearity of seeds to be generated. In the case of FIG. 16, fifteen switch states can be generated corresponding to the data Q.

As described above, according to the present embodiment, it is possible to obtain an advantageous effect substantially equivalent to the advantageous effect of the first embodiment. In addition to the above, it is possible to further increase nonlinearity of seeds to be generated.

Third Embodiment

Each S-box of the seed generator circuit SG of the first embodiment performs inverse transformation in one Galois field GF(256) by using one kind of S-box. However, in a third embodiment, a seed generator circuit SG performs inverse transformation of two kinds in Galois fields GF by using two kinds of S-boxes.

The configurations of a semiconductor device, a memory controller, and a randomizer of the third embodiment are substantially equivalent to the configurations of the semiconductor storage device 1, the memory controller 2, and the randomizer 17 of the above-mentioned first embodiment (including the modification) and hence, the repeated description will be omitted. The same constitutional elements are given the same reference symbols and the repeated description will be omitted, and the description will be made only for the configuration which makes the present embodiment different from the first embodiment.

In the first embodiment, the S-box unit of the seed generator circuit SG includes the four S-boxes (the table TBL), each of which performs the same nonlinear transformation that outputs an 8-bit output in response to an 8-bit input for 32-bit output data. However, in the present embodiment, the seed generator circuit SG includes two S-box units, each of which outputs 16-bit output in response to a 16-bit input for 32-bit output data. Each S-box unit includes an S-box that performs a nonlinear transformation that outputs a 7-bit output in response to a 7-bit input, and an S-box that performs a nonlinear transformation that outputs a 16-bit output in response to a 16-bit input. In other words, each of the plurality of S-box units includes at least two S-box circuits which output different numbers of bits.

Figure 17:
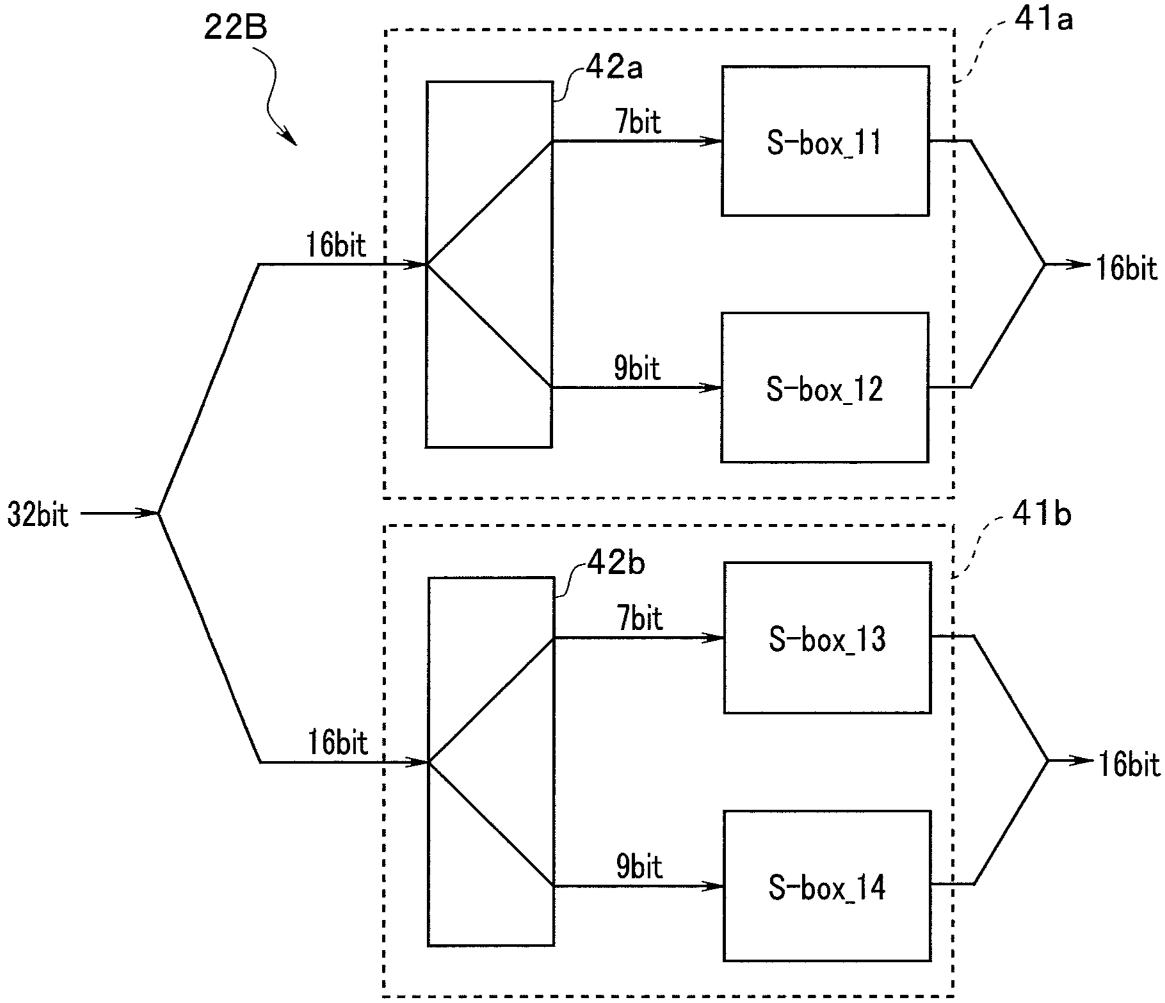
FIG. 17 is a block diagram of an S-box unit according to a third embodiment.

FIG. 17 is a block diagram of the S-box unit of the present embodiment. An S-box unit 22B includes two sub-S-box units 41*a*, 41*b*. The sub-S-box unit 41*a* includes a data separator 42*a*, an S-box_11, and an S-box_12. The sub-S-box unit 41*b* includes a data separator 42*b*, an S-box_13, and an S-box_14. The S-box_11 and the S-box_13 perform the same non-transformation process. The S-box_12 and the S-box_14 perform the same non-transformation process.

Data can be converted to (n+m) bits by using two kinds of Galois fields GF($2^n$) and GF($2^m$). In the present embodiment, "n" and "m" are positive integers. For example, in the case of GF(128) and GF(512), GF(128) uses an S-box that uses an irreducible polynomial of ($X^7$+x+1), and GF(512) uses an S-box that uses an irreducible polynomial of ($X^9$+$X^6$+$X^4$+$X^3$+1). In other words, a nonlinear transformation of 16 bits can be performed by using two kinds of S-boxes.

The data separator 42*a* receives, as input, upper 16-bit data of 32-bit data from the XorShift 21. The data separator 42*a* separates the inputted upper 16-bit data into 7-bit data on the upper side and 9-bit data on the lower side, and supplies the 7-bit data to the S-box_11, and supplies the 9-bit data to the S-box_12.

The data separator 42*b* receives, as input, lower 16-bit data of the 32-bit data from the XorShift 21. The data separator 42*b* separates the inputted lower 16-bit data into 7-bit data on the upper side and 9-bit data on the lower side, and supplies the 7-bit data to the S-box_13, and supplies the 9-bit data to the S-box_14.

FIG. 18 is a view showing an example of a conversion table for 7-bit conversion corresponding to a polynomial of the S-box_11 and S-box_13. FIG. 19 is a view showing an example of a conversion table for 9-bit conversion corresponding to a polynomial of the S-box_12 and S-box_14.

Each of the S-box_11 and the S-box_13 includes a conversion table generated based on GF(128). Each of the S-box_12 and the S-box_14 includes a conversion table generated based on GF(512).

The present embodiment can also obtain advantageous effects substantially equivalent to the advantageous effects of the first embodiment.

Fourth Embodiment

In the first embodiment, random number sequence data generated by the random number generator circuit are directly used in the XOR operation of the random number sequence data and user data for each bit. However, in the present embodiment, random number sequence data generated by the random number generator circuit are partially exchanged, and the exchanged random number sequence data are used in the XOR operation of the exchanged random number sequence data and user data for each bit.

The configurations of a semiconductor device, a memory controller, and a randomizer of a fourth embodiment are substantially equivalent to the configurations of the semiconductor storage device 1, the memory controller 2, and the randomizer 17 of the above-mentioned first embodiment and hence, the repeated description will be omitted. The same constitutional elements are given the same reference symbols and the repeated description will be omitted, and the description will be made only for the configuration which makes the present embodiment different from the first embodiment.

Figure 20:
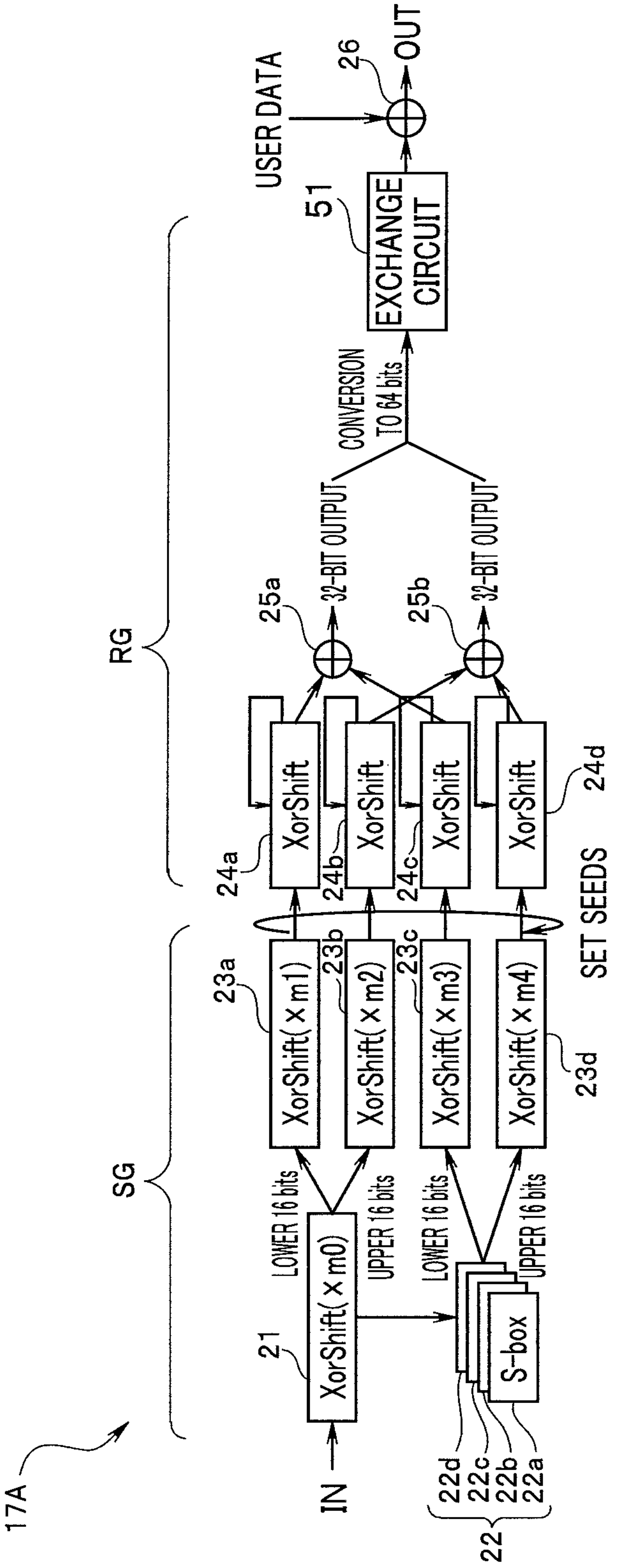
FIG. 20 is a block diagram showing a configuration of a randomizer according a fourth embodiment.

FIG. 20 is a block diagram showing the configuration of a randomizer 17A of the present embodiment. A random number generator circuit RG includes an exchange circuit 51 that exchanges data positions in random number sequence data. Two 32-bit output data from the XOR 25*a*, 25*b* are concatenated to be converted to 64 bits, and are inputted to the exchange circuit 51.

Figure 21:
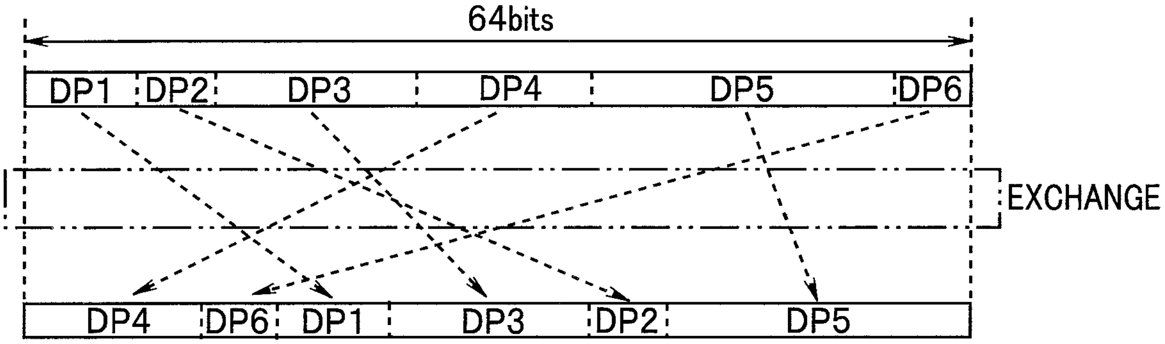
FIG. 21 is a view for describing a processing content performed by an exchange circuit according to the fourth embodiment.

FIG. 21 is a view for describing a processing content performed by the exchange circuit 51. The exchange circuit 51 is a circuit that performs processing of partially exchanging inputted bit string data according to a predetermined rule. In FIG. 21, 64-bit data are divided into six pieces of partial data DP1 to DP6, and positions of the respective partial data in a (4-bit string are exchanged by the exchange processing performed by the exchange circuit 51.

In the writing and reading of data, the same exchange processing is performed and hence, randomized user data are correctively restored to original user data.

The present embodiment can also obtain advantageous effects substantially equivalent to the advantageous effects of the first embodiment.

Fifth Embodiment

In the random number generator circuit RG of the first embodiment, data from the seed generator circuit SG are directly inputted to the XorShifts 24*a* to 24*d*, or data from the XORs 25*ax*, 25*bx* are inputted to the XorShifts 24*ax*, 24*bx*. However, in the present embodiment, a predetermined bit operation is performed on data to be inputted to at least one of two XorShifts of the random number generator circuit RG, and the data on which the predetermined bit operation is performed are inputted to at least one of the two XorShifts.

The configurations of a semiconductor device, a memory controller, and a randomizer of a fifth embodiment are substantially equivalent to the configurations of the semiconductor storage device 1, the memory controller 2, and the randomizer 17 of the above-mentioned first embodiment and hence, the repeated description will be omitted. The same constitutional elements are given the same reference symbols and the repeated description will be omitted, and the description will be made only for the configuration which makes the present embodiment different from the first embodiment.

Figure 22:
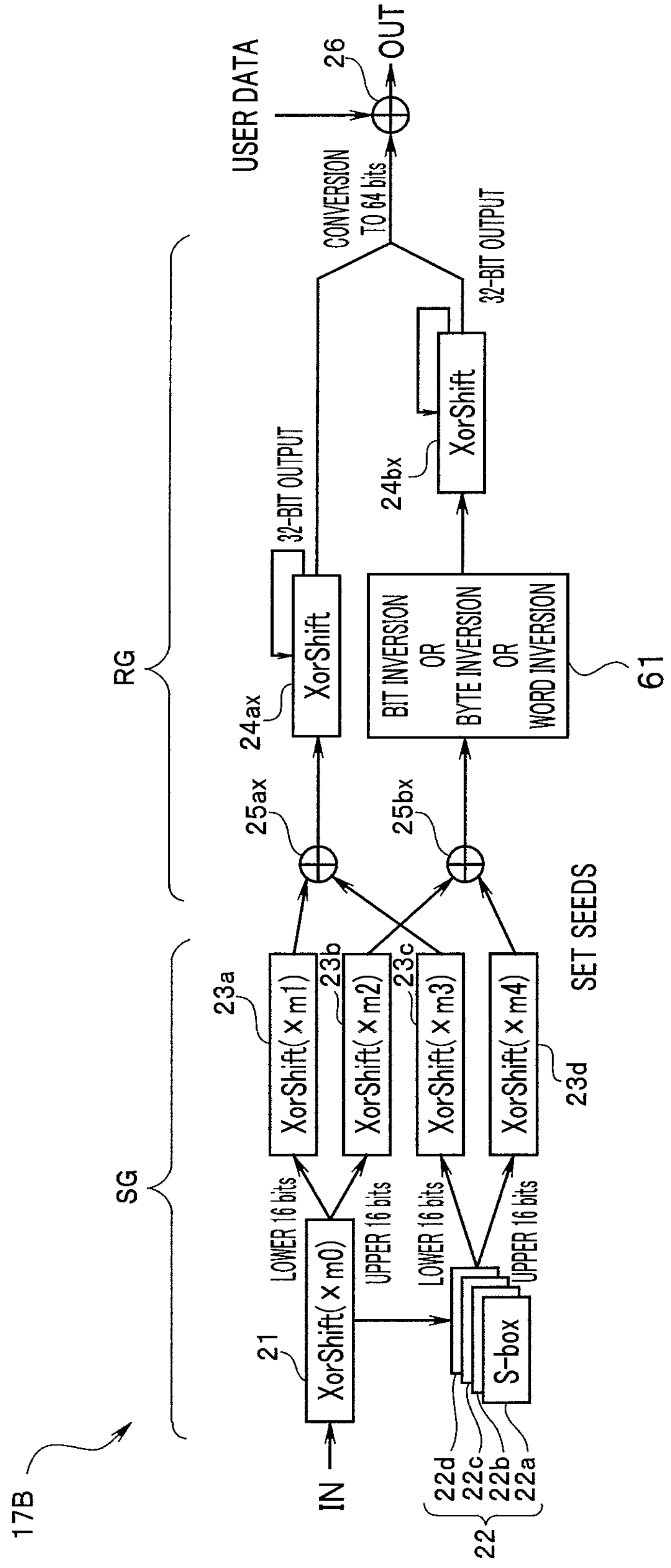
FIG. 22 is a block diagram showing a configuration of a randomizer according to a fifth embodiment.

FIG. 22 is a block diagram showing the configuration of a randomizer 17B according to the present embodiment. The randomizer 17B in FIG. 22 corresponds to the randomizer 17*x* in FIG. 9. In the present embodiment, a predetermined bit operation is performed on data to be inputted to one of two XorShifts.

In FIG. 22, an output from the XOR 25*ax* is directly inputted to the XorShift 24*ax*, but an output from the XOR 25*bx* is inputted to an inversion circuit 61 that shuffles bit string data. In other words, an output from one of the two XORs 25*ax*, 25*bx* is shuffled by the inversion circuit 61. The bit string data shuffled by the inversion circuit 61 are inputted to the XorShift 24*bx*. The inversion circuit 61 performs inversion processing of any one of bit inversion, byte inversion, or word inversion.

In the present embodiment, the inversion processing is performed before the output from the XOR 25*bx* is inputted to the XorShift 24*bx*. However, the inversion circuit 61 may be provided to the output of the XorShift 24*bx*.

As described above, the random number generator circuit RG includes the inversion circuit 61 that performs the bit inversion, the byte inversion, or the word inversion before or after performing the XorShift operation by the XorShift 24*ax* or 24*bx*.

Figure 23:
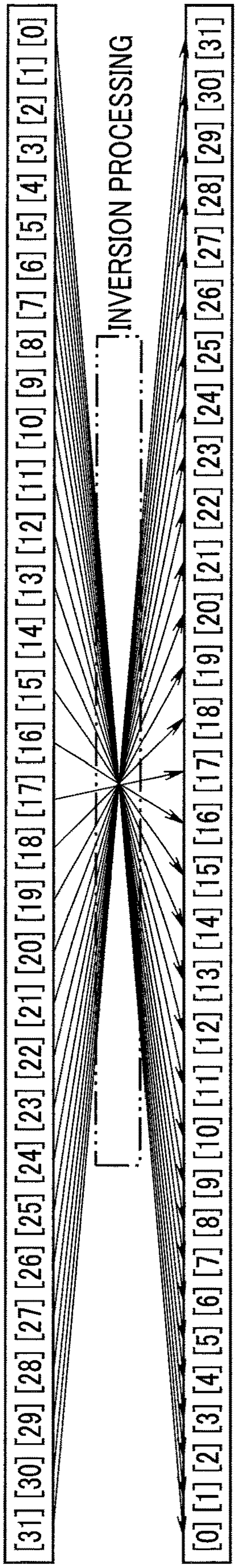
FIG. 23 is a view for describing inversion processing of bit inversion according to the fifth embodiment.

FIG. 23 is a view for describing the inversion processing of bit inversion. When the inversion circuit 61 performs the bit inversion processing, as shown in FIG. 23, 32-bit input data inputted to the inversion circuit 61 are inverted in units of a bit, and 32-bit data obtained by performing the bit inversion are outputted as output data. In other words, the bit inversion is processing of rearranging bit string data ranging from the LSB (least significant bit) to the MSB (most significant bit) such that the order of the bit string ranging from the LSB (least significant bit) to the MSB (most significant bit) is reversed.

Figure 24:
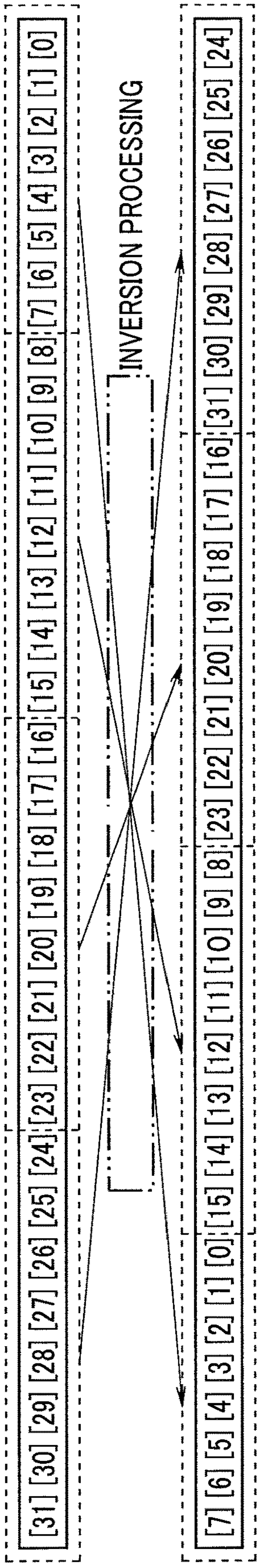
FIG. 24 is a view for describing inversion processing of byte inversion according to the fifth embodiment.

FIG. 24 is a view for describing the inversion processing of byte inversion. When the inversion circuit 61 performs the byte inversion processing, as shown in FIG. 24, 32-bit input data inputted to the inversion circuit 61 are inverted in units of a byte, and the 32-bit data obtained by performing the byte inversion are outputted as output data. In other words, the byte inversion is processing of dividing 32-bit data in units of a byte, and of rearranging the order of the data in units of a byte such that the order is reversed.

Figure 25:
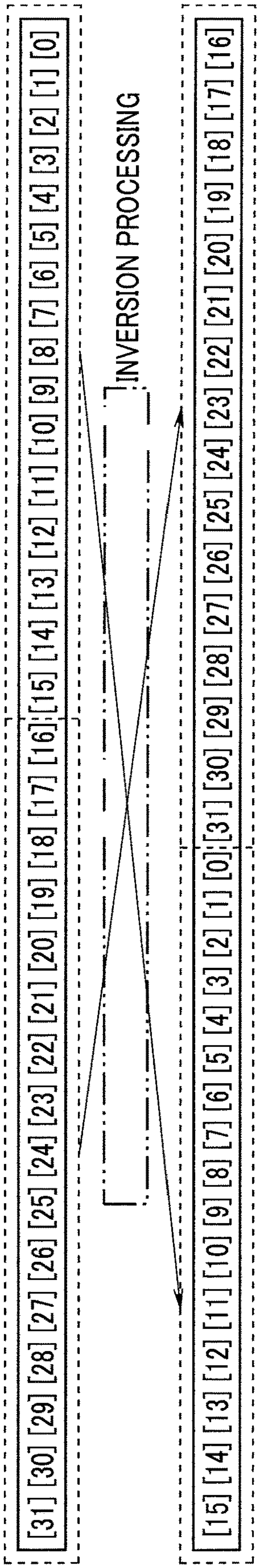
FIG. 25 is a view for describing inversion processing of word inversion according to the fifth embodiment.

FIG. 25 is a view for describing the inversion processing of word inversion. When the inversion circuit 61 performs the word inversion processing, as shown in FIG. 25, 32-bit input data inputted to the inversion circuit 61 are inverted in units of a word, and 32-bit data obtained by performing the word inversion are outputted as output data. In other words, the word inversion is processing of dividing 32-bit data in units of a word, and of rearranging the order of the data in units of a word such that the order is reversed.

The present embodiment can also obtain advantageous effects substantially equivalent to the advantageous effects of the first embodiment.

Sixth Embodiment

In the first embodiment, the S-boxes are used in the seed generator circuit SG. However, in the present embodiment, S-boxes are not used in the seed generator circuit SG but, in the random number generator circuit RG, two XorShifts are crossed, and seeds are diffused by using the S-boxes.

The configurations of a semiconductor device, a memory controller, and a randomizer of a sixth embodiment are substantially equivalent to the configurations of the semiconductor storage device 1, the memory controller 2, and the randomizer 17 of the above-mentioned first embodiment and hence, the repeated description will be omitted. The same constitutional elements are given the same reference symbols and the repeated description will be omitted, and the description will be made only for the configuration which makes the present embodiment different from the first embodiment.

Figure 26:
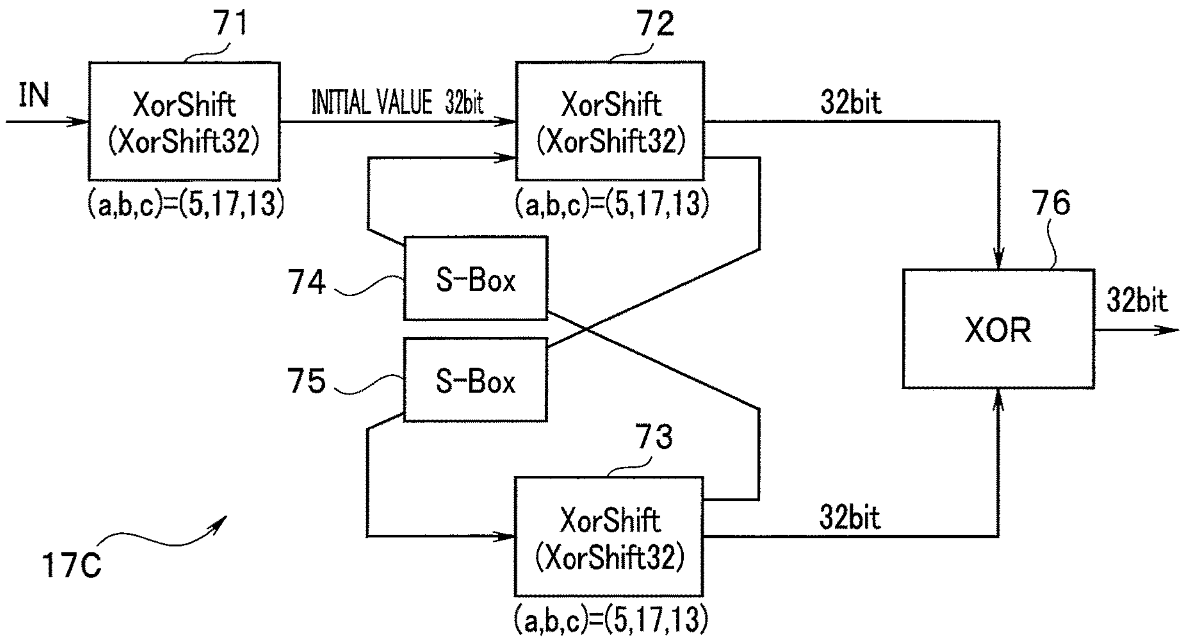
FIG. 26 is a block diagram showing a configuration of a randomizer according to a sixth embodiment.

FIG. 26 is a block diagram showing the configuration of a randomizer 17C according to the present embodiment. The randomizer 17C includes three XorShifts 71, 72, 73, two S-boxes 74, 75, and an XOR 76.

In the present embodiment, the seed generator circuit SG includes one XorShift 71. The XorShift 71 is an XorShift32 that shifts 32-bit data containing an inputted index number to the left by 5 bits, to the right by 17 bits, and to the left by 13 bits. In FIG. 26, (a, b, c)=(5, 17, 13) indicates that the XorShift32 shifts inputted bit string data to the left by 5 bits, to the right by 17 bits, and to the left by 13 bits. An output from the XorShift 71 is supplied to the XorShift 72 as an initial value, that is, as a seed.

The XorShift 72 outputs a 32-bit output to the S-box 75 and the XOR 76. An output from the S-box 75 is supplied to the XorShift 73. The XorShift 73 outputs a 32-bit output to the S-box 74 and the XOR 76.

As described above, the random number generator circuit RG includes the wo XorShifts 72, 73 and the two S-boxes 74, 75. An input of the XorShift 72 is connected to an output of the S-box 74, and an output of the XorShift 72 is connected to an input of the S-box 75. An input of the XorShift 73 is connected to an output of the S-box 75, and an output of the XorShift 73 is connected to an input of the S-box 74.

The XorShift 72 uses an input on which nonlinear transformation processing is performed by the S-box 74, and the XorShift 73 uses an input on which nonlinear transformation processing is performed by the S-box 75. Two outputs from the XorShifts 72, 73 are subjected to the XOR operation to output random number sequence data being 32-bit output.

Although not shown in the drawing, XOR of user data and the random number sequence data is performed, so that the user data are randomized.

The present embodiment can also obtain advantageous effects substantially equivalent to the advantageous effects of the first embodiment.

Seventh Embodiment

In the sixth embodiment, the random number generator circuit includes the two XorShifts and the two S-boxes. However, in the present embodiment, a random number generator circuit includes a plurality of stages of units each including two XorShifts and two S-boxes.

The configurations of a semiconductor device, a memory controller, and a randomizer of a seventh embodiment are substantially equivalent to the configurations of the semiconductor storage device 1, the memory controller 2, and the randomizer 17, 17C of the above-mentioned first embodiment and sixth embodiment and hence, the repeated description will be omitted. The same constitutional elements are given the same reference symbols and the repeated description will be omitted, and the description will be made only for the configuration which makes the present embodiment different from the first embodiment and the sixth embodiment.

Figure 27:
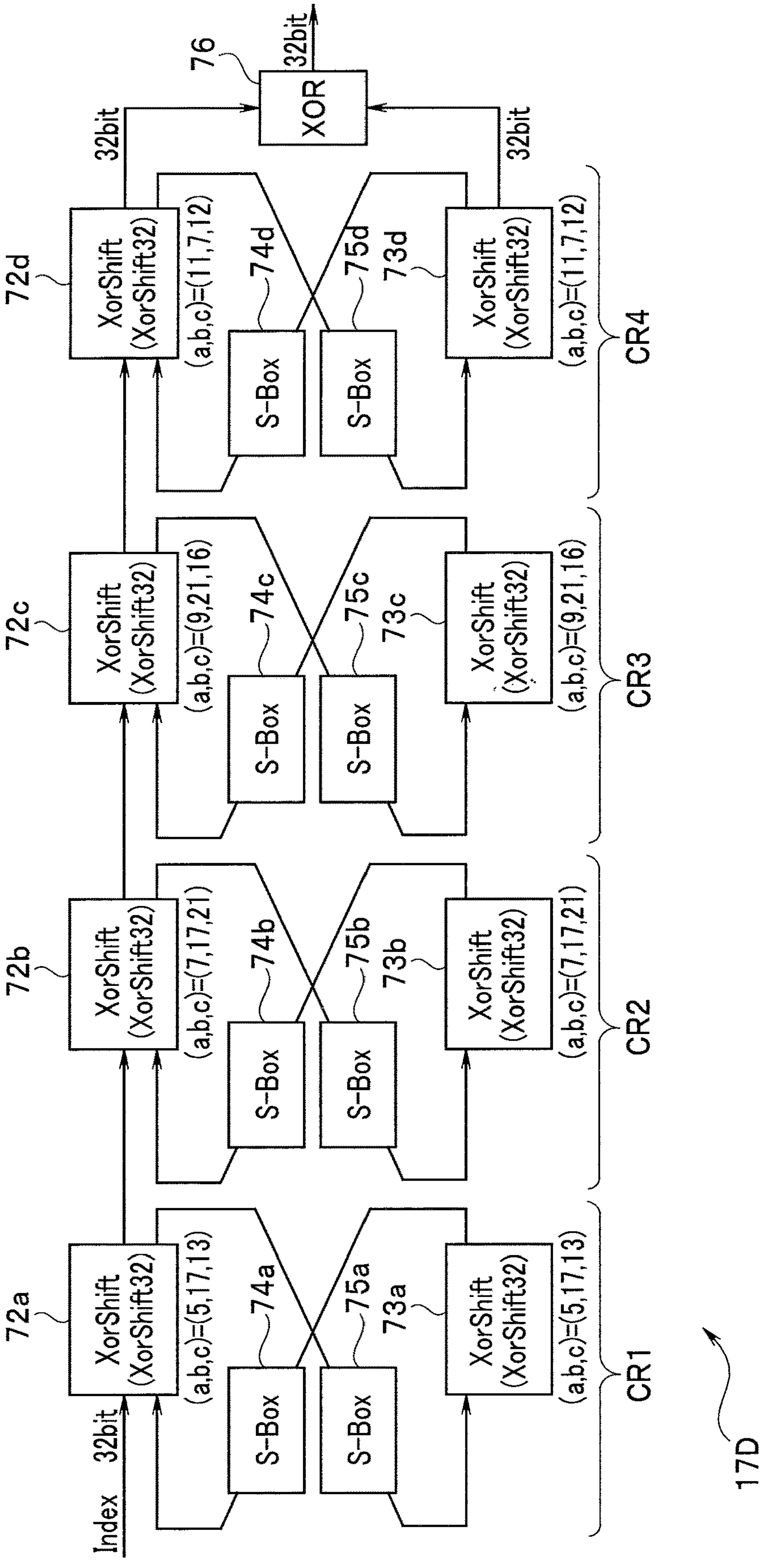
FIG. 27 is a block diagram showing a configuration of a randomizer according to a seventh embodiment.

FIG. 27 is a block diagram showing the configuration of a randomizer 17D according to the present embodiment. The randomizer 17D includes multiple stages (four stages in the present embodiment) of the units, each of which is formed of two XorShifts and two S-boxes. The randomizer 17D includes eight XorShifts 72*a*, 72*b*, 72*c*, 72*d*, 73*a*, 73*b*, 73*c*, 73*d*, eight S-boxes 74*a*, 74*b*, 74*c*, 74*d*, 75*a*, 75*b*, 75*c*, 75*d*, and the XOR 76. Hereinafter, all or each of the four XorShifts 72*a*, 72*b*, 72*c*, 72*d* is abbreviated as "XorShift 72", and all or each of four XorShifts 73*a*, 73*b*, 73*c*, 73*d* is abbreviated as "XorShift 73". In the same manner, all or each of four S-boxes 74*a*. 74*b*, 74*c*. 74*d* is abbreviated as "S-box 74", and all or each of four S-boxes 75*a*, 75*b*, 75*c*, 75*d* is abbreviated as "S-box 75". Each of the S-boxes 74, 75 includes four S-boxes, each of which outputs an 8-bit output in response to an 8-bit input, for example.

More specifically, the four units are connected in series. A first unit CR1 includes the two XorShifts 72*a*, 73*a*, and the two S-boxes 74*a*, 75*a*. A second unit CR2 includes the two XorShifts 72*b*, 73*b*, and the two S-boxes 74*b*. 75*b*. A third unit CR3 includes the two XorShifts 72*c*, 73*c*, and the two S-boxes 74*c*, 75*c*. A fourth unit CR4 includes the two XorShifts 72*d*, 73*d*, and the two S-boxes 74*d*, 75*d*.

In the present embodiment, a shift amount used in two XorShift operations of each unit differs among the first to fourth units CR1 to CR4 as shown in FIG. 27.

In each of the units CR1 to CR4, the two XorShifts 72, 73 have the same shift amount to the left and right (a, b, c). However, the two XorShifts 72, 73 may have different shift amounts to the left and right.

A connection between the two XorShifts and the two S-boxes in each of the units CR1 to CR4 is equivalent to the connection between the two XorShifts and the two S-boxes shown in FIG. 26. The XorShift 72*a* of the first unit CR1 receives the index number IN as input. The XorShift 72*b* of the second unit CR2 receives an output from the XorShift 72*a* as input. The XorShift 72*c* of the third unit CR3 receives an output from the XorShift 72*b* as input. The XorShift 72*d* of the fourth unit CR4 receives an output from the XorShift 72*c* as input.

The XOR 76 receives an output from the XorShift 72*d* of the fourth unit CR4 and an output from the XorShift 73*d*.

The first unit CR1 to the fourth unit CR4 are operated one time in response to an input of the index number IN, and the fourth unit CR4 outputs output data a number of times obtained by dividing the input by 32.

The present embodiment can also obtain advantageous effects substantially equivalent to the advantageous effects of the first embodiment.

Eighth Embodiment

In the first embodiment, the random number generator circuit outputs 64-bit data by using the XorShift32. However, in the present embodiment, a random number generator circuit outputs (4-bit data by using an XorShift56.

The configurations of a semiconductor device, a memory controller, and a randomizer of an eighth embodiment are substantially equivalent to the configurations of the semiconductor storage device 1, the memory controller 2, and the randomizer 17 of the above-mentioned first embodiment and hence, the repeated description will be omitted. The same constitutional elements are given the same reference symbols and the repeated description will be omitted, and the description will be made only for the configuration which makes the present embodiment different from the first embodiment.

Figure 28:
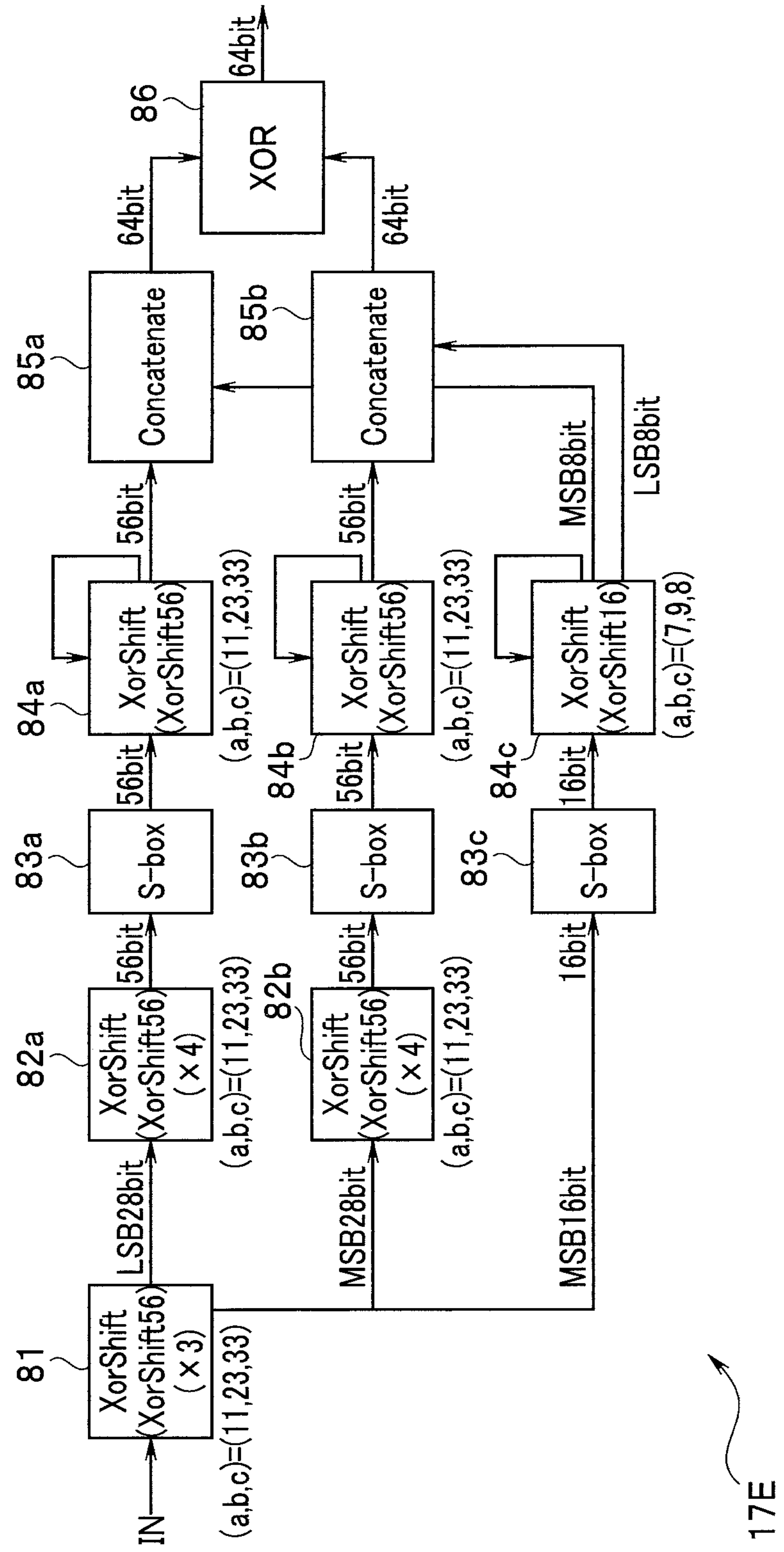
FIG. 28 is a block diagram showing a configuration of a randomizer according to an eighth embodiment.

FIG. 28 is a block diagram showing the configuration of a randomizer 17E according to the present embodiment. The randomizer 17E includes six XorShifts 81, 82*a*, 82*b*, 84*a*, 84*b*, 84*c*, three S-boxes 83*a*, 83*b*, 83*c*, two concatenation circuits (Concatenates) 85*a*, 85*b*, and an XOR 86. Each of the five XorShifts 81, 82*a*, 82*b*, 84*a*, 84*b* is an XorShift56 that generates 56-bit random number sequence data. The XorShift 84*c* is an XorShift16 that generates 16-bit random number sequence data.

Each of the five XorShifts 81, 82*a*, 82*b*, 84*a*, 84*b* is the XorShift56 that shifts data to the left by 11 bits, to the right by 23 bits, and to the left by 33 bits. The XorShift 84*c* is the XorShift16 that shifts data to the left by 7 bits, to the right by 9 bits, and to the left by 8 bits. In FIG. 28, (a, b, c)=(11, 23, 33) indicates that the XorShift56 shifts inputted bit string data to the left by 11 bits, to the right by 23 bits, and to the left by 33 bits. In FIG. 28, (a, b, c)=(7, 9, 8) indicates that the XorShift16 shifts inputted bit string data to the left by 7 bits, to the right by 9 bits, and to the left by 8 bits.

The XorShift 81 receives an index number IN as input, supplies 28 bits on the lower side (LSB 28 bits) to the XorShift 82*a*, and supplies 28 bits on the upper side (MSB 28 bits) to the XorShift 82*b*. The XorShift 81 also supplies 16 bits on the lower side (LSB 16 bits) to the S-box 83*c*.

The XorShift 81 performs the generation of random number sequence data by three cycles. In the first two cycles, the XorShift 81 does not output generated random number sequence data, but outputs random number sequence data generated in the third round. Specifically, the XorShift 81 performs the idling of generating random number sequence data two times and, thereafter, outputs random number sequence data generated in the third round.

The XorShift 82*a*, 82*b* output random number sequence data to the S-boxes 83*a*, 83*b* respectively. Each of the S-boxes 83*a*, 83*b* outputs 56-bit bit string data obtained by performing nonlinear transformation on 56-bit input data. The S-box 83*c* outputs 16-bit bit string data obtained by performing nonlinear transformation on 16-bit input data.

More specifically, the XorShifts 82*a*. 82*b* perform the generation of random number sequence data by four cycles. In the first three cycles, the XorShifts 82*a*, 82*b* do not output generated random number sequence data, but output random number sequence data generated in the fourth round. Specifically, the XorShifts 82*a*, 82*b* perform the idling of generating random number sequence data three times and, thereafter, outputs random number sequence data generated in the fourth round.

The S-boxes 83*a*, 83*b*, 83*c* respectively output bit string data obtained by performing nonlinear transformation to the XorShifts 84*a*. 84*b*, 84*c* as seeds.

The XorShifts 84*a*, 84*b* respectively output generated random number sequence data to the Concatenates 85*a*, 85*b*. The XorShift 84*c* outputs 8-bit data on the upper side of the generated random number sequence data to the Concatenate 85*a*, and outputs 8-bit data on the lower side of the generated random number sequence data to the Concatenate 85*b*.

The XorShifts 84*a*, 84*b*. 84*c* output the same output data a number of times obtained by dividing user data by 56 bits.

The XOR 86 performs XOR operation of 64-bit output data from the Concatenate 85*a* and 64-bit output data from the Concatenate 85*b* for each bit, and outputs 64-bit random number sequence data. An XOR not shown in the drawing performs XOR operation of output data from the XOR 86 and user data, so that the user data are randomized. The randomized user data are held in the nonvolatile memory 3.

As described above, 56-bit random number sequence data can be acquired from each of the two XorShifts 84*a*, 84*b*. To convert 56 bits to 64 bits, 8 bits forming a part of 16 bits from the XorShift 84*c* are used for missing 8 bits. Concatenating the 8 bits and the 56 bits can generate 64-bit random number sequence data.

The XorShift16 that generates 16-bit random number sequence data is used as a part of the plurality of XorShifts. However, each of all XorShifts may be the XorShift56.

Figure 29:
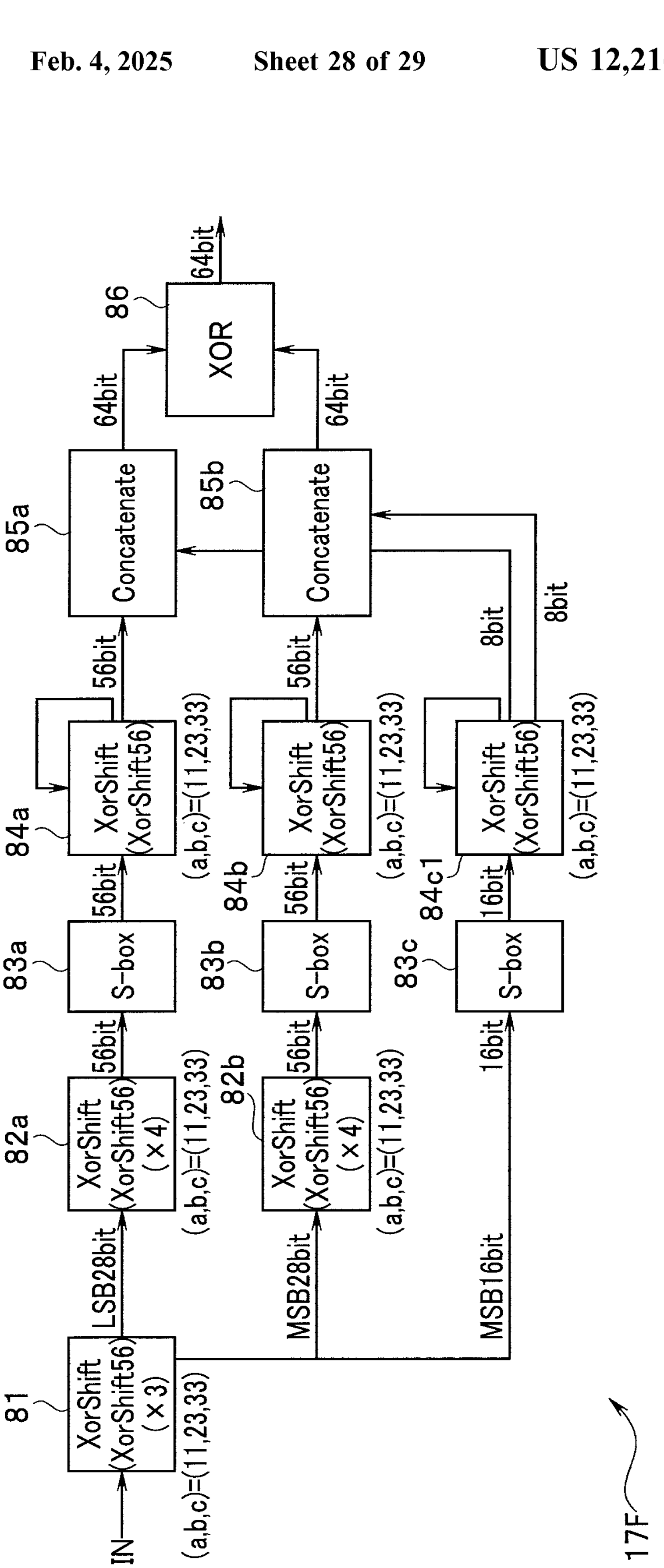
FIG. 29 is a block diagram showing a configuration of a randomizer according to a modification of the eighth embodiment.

FIG. 29 is a block diagram showing the configuration of a randomizer 17F according to a modification of the randomizer shown in FIG. 28. The randomizer 17F differs from the randomizer 17E with respect to a point that each of all XorShifts is the XorShift56. In the randomizer 17F shown in FIG. 29, an XorShift 84*c*1 being the XorShift56 is used in place of the XorShift 84*c* being the XorShift16 in FIG. 28.

Figure 30:
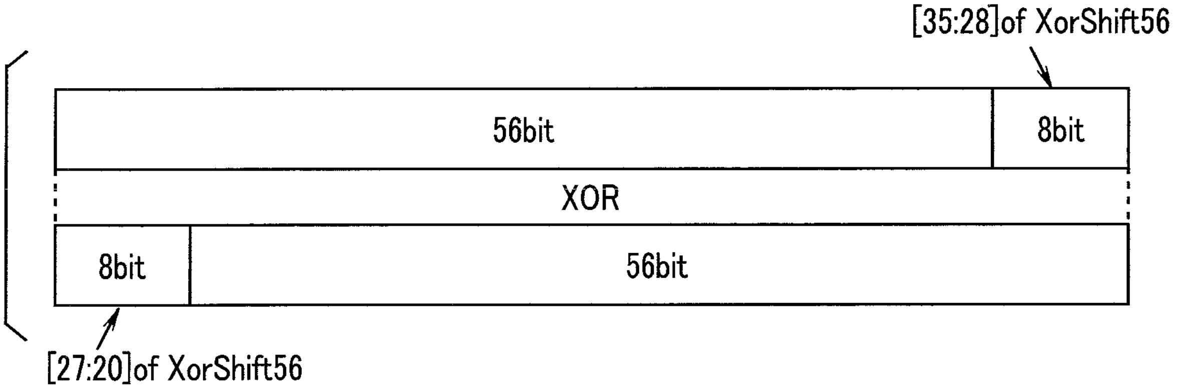
FIG. 30 is a view for describing an XOR operation in an XOR according to the eighth embodiment.

FIG. 30 is a view for describing XOR operation performed by the XOR 86. In the Concatenates 85*a* and 85*b*, 8-bit data are concatenated to 56-bit data. In FIG. 30, one 64-bit inputted to the XOR 86 is 64-bit data obtained by concatenating 8-bit data to the upper side of 56-bit data, and the other (A-bit inputted to the XOR 86 is 64-bit data obtained by concatenating 8-bit data to the lower side of 56-bit data. One concatenating 8-bit contains 8 bits ranging from the 27th bit to the 20th bit out of the 56 bits. The other concatenating 8-bit contains 8 bits ranging from the 35th bit to the 28th bit out of the 56 bits. The XOR 86 outputs, as random number sequence data, 64-bit data obtained by performing XOR operation of two pieces of the 64-bit data for each bit.

The present embodiment can also obtain advantageous effects substantially equivalent to the advantageous effects of the first embodiment.

As described above, according to the above-mentioned respective embodiments and respective modifications, it is possible to provide a semiconductor device and a semiconductor storage device having high extensibility of data size of random number sequence data to be generated and a small circuit scale.

In the respective embodiments and the respective modifications, to diffuse output data from the XorShift or the S-box, the randomizer may additionally include an affine transformation circuit that performs predetermined affine transformation processing on output data from the XorShift or the S-box.

In the respective embodiments and the respective modifications, an index number IN is decided based on a page (or a page and a frame number). However, in the case where the memory cell array 3*a* includes a plurality of blocks BLK, an index number IN is decided based on a block number and a page (or a page and a frame number).

Conventionally, in a nonvolatile memory, such as a NAND flash memory, fragile random number sequence data may be generated due to the memory structure or the like of the nonvolatile memory. However, according to the above-mentioned respective embodiments and respective modifications, it is possible to generate random number sequence data with high robustness against various defective modes caused by an effect, such as the memory structure.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A method of generating a random number, comprising:
generating first random number sequence data by performing a first XorShift operation on inputted data;
generating a seed by using the first random number sequence data; and
generating second random number sequence data by performing a second XorShift operation on the seed, wherein
the first random number sequence data are generated by using a plurality of XorShift circuits and a nonlinear transformation circuit, and
the nonlinear transformation circuit is configured to perform a nonlinear transformation on output data from at least one of the plurality of XorShift circuits.

2. The method according to claim 1, wherein
the plurality of XorShift circuits include a first XorShift circuit and a second XorShift circuit,
the first XorShift circuit is configured to perform the first XorShift operation on the inputted data, and
the second XorShift circuit is configured to perform processing on output data from both the first XorShift circuit and the nonlinear transformation circuit to generate the seed.

3. The method according to claim 2, further comprising:
performing an XOR operation on an operation result of the second XorShift operation to generate the second random number sequence data.

4. The method according to claim 2, further comprising:
performing an XOR operation on an operation result from the second XorShift circuit; and
performing the second XorShift operation on an operation result of the XOR operation to generate the second random number sequence data.

5. The method according to claim 1, wherein
the nonlinear transformation circuit includes a plurality of S-box circuits configured to perform a nonlinear transformation of a same kind.

6. The method according to claim 1, wherein
the nonlinear transformation circuit includes a plurality of S-box circuits configured to perform a plurality of kinds of different nonlinear transformations.

7. The method according to claim 6, wherein
the plurality of S-box circuits include at least two S-box circuits configured to output different numbers of bits.

8. The method according to claim 1, further comprising:
exchanging data positions in the second random number sequence data.

9. The method according to claim 1, further comprising:
performing bit inversion, byte inversion, or word inversion before or after performing the second XorShift operation.

10. The method according to claim 1, wherein
the method is performed in a semiconductor device,
the semiconductor device includes a first XorShift circuit, a second XorShift circuit, a first S-box circuit, and a second S-box circuit,
the first XorShift circuit includes a first input and a first output,
the second XorShift circuit includes a second input and a second output, the first input is connected to an output of the first S-box circuit, and the first output is connected to an input the second S-box circuit, and the second input is connected to an output of the second S-box circuit, and the second output is connected to an input of the first S-box circuit.

11. The method according to claim 1, wherein the method is performed in a semiconductor device, the semiconductor device includes a plurality of units, each of which includes a first XorShift circuit, a second XorShift circuit, a first S-box circuit, and a second S-box circuit, in each of the plurality of units, the first XorShift circuit includes a first input and a first output, and the second XorShift circuit includes a second input and a second output, the first input is connected to an output of the first S-box circuit, and the first output is connected to an input of the second S-box circuit, the second input is connected to an output of the second S-box circuit, and the second output is connected to an input of the first S-box circuit, and a bit shift amount used in the first and second XorShift circuits of each of the plurality of units differs among the plurality of units.

12. A method of controlling a nonvolatile memory, the method comprising:

generating first random number sequence data by performing a first XorShift operation on storage location data indicating a storage location of the data in the nonvolatile memory;

generating a seed by using the first random number sequence data; and generating second random number sequence data by performing a second XorShift operation on the seed, wherein the first random number sequence data are generated by using a plurality of XorShift circuits and a nonlinear transformation circuit, and the nonlinear transformation circuit is configured to perform a nonlinear transformation on output data from at least one of the plurality of XorShift circuits.

13. The method according to claim 12, further comprising:

storing the data at the storage location in the nonvolatile memory designated by a page number; wherein the storage location data contains the page number, or the page number and a frame number contained in the page number.

14. The method according to claim 12, further comprising:

randomizing user data using the second random number sequence data; and storing the randomized user data as the data at the storage location in the nonvolatile memory.

15. The method according to claim 12, wherein the plurality of XorShift circuits include a first XorShift circuit and a second XorShift circuit, the first XorShift circuit is configured to perform the first XorShift operation on the storage location data, and the second XorShift circuit is configured to perform processing on output data from both the first XorShift circuit and the nonlinear transformation circuit to generate the seed.

16. The method according to claim 15, further comprising:

performing an XOR operation on an operation result of the second XorShift operation to generate the second random number sequence data.

17. The method according to claim 15, further comprising:

performing an XOR operation on an operation result from the second XorShift circuit; and performing the second XorShift operation on an operation result of the XOR operation to generate the second random number sequence data.

18. The method according to claim 12, wherein the nonlinear transformation circuit includes a plurality of S-box circuits configured to perform a nonlinear transformation of a same kind.

* * * * *